(12) United States Patent
Kitajima et al.

(10) Patent No.: US 6,184,475 B1
(45) Date of Patent: *Feb. 6, 2001

(54) LEAD-FREE SOLDER COMPOSITION WITH BI, IN AND SN

(75) Inventors: Masayuki Kitajima; Masakazu Takesue; Yasuo Moriya; Yoshinori Nemoto; Yumiko Fukushima, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/526,929

(22) Filed: Sep. 12, 1995

(51) Int. Cl.$^7$ ..................................... A05K 1/16
(52) U.S. Cl. ............... 174/260; 174/257; 228/248.1; 228/224; 420/557; 420/562
(58) Field of Search ................ 148/24; 420/557, 420/562; 228/248.1, 224; 174/260, 257

(56) References Cited

U.S. PATENT DOCUMENTS

| | | | |
|---|---|---|---|
| 4,214,903 | * | 7/1980 | Murabayashi et al. ............... 420/577 |
| 5,256,370 | | 10/1993 | Slattery et al. . |
| 5,308,578 | * | 5/1994 | Wong .................................... 420/558 |
| 5,328,660 | * | 7/1994 | Gonya et al. ......................... 420/562 |
| 5,368,814 | * | 11/1994 | Gonya et al. ......................... 420/587 |
| 5,527,628 | * | 6/1996 | Anderson et al. .................... 428/647 |
| 5,556,023 | * | 9/1996 | Kuramoto et al. ................. 228/248.1 |
| 5,607,609 | * | 3/1997 | Sakuyama et al. ................... 219/385 |

FOREIGN PATENT DOCUMENTS

| | | | |
|---|---|---|---|
| 612578 A1 | * | 8/1994 | (EP) . |
| 6-238479 | | 8/1994 | (JP) . |

* cited by examiner

*Primary Examiner*—Jeffrey Gaffin
*Assistant Examiner*—Kamand Cuneo
(74) *Attorney, Agent, or Firm*—Arent Fox Kintner Plotkin & Kahn, PLLC

(57) ABSTRACT

A lead-free solder alloy composition contains Sn, Bi and In, with respective contents such that the solder alloy composition provides a liquidus temperature below the heat resistant temperature of a work to be soldered. The alloy contains not more than about 60 wt % Bi; not more than about 50 wt % In; optionally at least one element selected from Ag, Zn, Ge, Ga, Sb, and P; and Sn. Also, lead-free solder powders containing same, and printed circuit boards, electronic components and electronic apparati employing such alloy.

12 Claims, 26 Drawing Sheets

F I G. 1

| | composition (wt%) | tensile strength (kg/mm²) | elongation (%) | time-to-failure (min) | fracture surface | Tm (°C) | evaluation |
|---|---|---|---|---|---|---|---|
| comp ex 1 | Sn42.00-Bi58.00-In 0 | 6.74 ○ | 30.00 — | 23.00 | brittle | 139 | ref |
| comp ex 2 | Sn41.96-Bi57.94-In 0.1 | 6.10 ○ | 28.73 × | 20.84 | brittle | 139 | × |
| ex 1-1 | Sn41.79-Bi57.71-In 0.5 | 5.85 ○ | 60.24 ○ | 44.12 | brittle | 139 | ○ |
| ex 1-2 | Sn41.58-Bi57.42-In 1.0 | 6.06 ○ | 58.56 ○ | 45.65 | brittle | 136 | ○ |
| ex 1-3 | Sn39.90-Bi55.10-In 5.0 | 5.19 ○ | 71.67 ○ | 55.76 | brittle | 129 | ○ |
| ex 1-4 | Sn37.80-Bi52.20-In10.0 | 5.25 ○ | 72.78 ○ | 54.18 | ductile | 124 | ○ |
| ex 1-5 | Sn33.60-Bi46.40-In20.0 | 2.79 ○ | 408.89 ○ | 247.97 | ductile | 117 | ○ |
| comp ex 3 | Sn45.00-Bi 5.0 -In50.0 | 1.70 × | 36.37 ○ | 30.21 | ductile | 114 | × |
| comp ex 4 | Sn48.00-Bi 0 -In52.0 | 1.17 × | 74.17 ○ | 49.47 | ductile | 117 | ref |

F I G. 2

| | composition (wt%) | tensile strength (kg/mm²) | elongation (%) | time-to-failure (min) | fracture surface | Tm (°C) | evaluation |
|---|---|---|---|---|---|---|---|
| comp ex 10 | Sn48.00-Bi 0 -In52.0 | 1.17× | 74.17○ | 49.47 | ductile | 117 | ref |
| comp ex 11 | Sn45.00-Bi 5.0 -In50.0 | 1.70× | 36.37○ | 30.21 | ductile | 114 | × |
| ex 2-1 | Sn38.00-Bi52.00-In10.0 | 5.25○ | 72.78○ | 54.18 | ductile | 124 | ○ |
| ex 2-2 | Sn40.00-Bi55.00-In 5.0 | 5.19○ | 71.67○ | 55.76 | brittle | 129 | ○ |
| comp ex 12 | Sn35.00-Bi60.00-In 5.0 | 5.57○ | 21.33× | 18.37 | brittle | 124 | × |
| comp ex 13 | Sn37.00-Bi60.00-In 3.0 | 5.79○ | 17.33× | 17.55 | brittle | 132 | × |
| comp ex 14 | Sn39.00-Bi60.00-In 1.0 | 5.80○ | 20.89× | 21.44 | brittle | 136 | × |
| comp ex 15 | Bi100.00 | 1.64× | 13.33× | 10.90 | brittle | 271 | ref |

F I G. 3

| | element | composition (wt%) | tensile strength (kg/mm²) | elongation (%) | time-to-failure (min) | fracture surface | Tm (°C) | evaluation |
|---|---|---|---|---|---|---|---|---|
| comp ex20 | — | Sn35-Bi60-In5 | 5.57 ○ | 21.33 × | 18.37 | brittle | 124 | ref |
| comp ex21 | Ag | Sn40-Bi50-In5-Ag5 | 6.51 ○ | 20.00 × | 18.02 | brittle | 137 | × |
| ex 3-1 | Ag | Sn40-Bi54-In5-Ag1 | 5.52 ○ | 34.44 ○ | 29.49 | ductile | 136 | ○ |
| comp ex22 | Zn | Sn40-Bi50-In5-Zn5 | 5.01 ○ | 13.33 × | 7.51 | brittle | 132 | × |
| ex 3-2 | Zn | Sn40-Bi54-In5-Zn1 | 5.58 ○ | 50.89 ○ | 40.61 | ductile | 122 | ○ |

F I G. 4

| | composition (wt%) | | | | tensile strength (kg/mm²) | elongation (%) | time-to-failure (min) | fracture surface | Tm (°C) | evaluation |
|---|---|---|---|---|---|---|---|---|---|---|
| | Sn | Pb | Bi | Ag | | | | | | |
| comp ex 30 | 63 | 37 | — | — | 4.960 | 20.56 | 19.75 | brittle | 183 | × |
| comp ex 31 | 42 | — | 58 | — | 6.741 | 30.0 | 23.00 | brittle | 139 | × |
| comp ex 32 | 96.5 | — | — | 3.5 | 2.915 | 30.20 | 22.23 | ductile | 220 | × |
| ex 4-1 | 91.7 | — | 5 | 3.3 | 7.713 | 12.67 | 11.14 | brittle | 220 | ○ |
| ex 4-2 | 86.9 | — | 10 | 3.1 | 8.434 | 9.33 | 5.65 | brittle | 139~220 | ○ |
| ex 4-3 | 82.0 | — | 15 | 3.0 | 8.7625 | 9.165 | 5.62 | brittle | | ○ |
| ex 4-4 | 77.2 | — | 20 | 2.8 | 9.099 | 6.67 | 3.95 | brittle | | ○ |
| ex 4-5 | 67.6 | — | 30 | 2.4 | 8.349 | 7.33 | 4.97 | brittle | | ○ |
| ex 4-6 | 57.9 | — | 40 | 2.1 | 7.5142 | 8.998 | 5.82 | brittle | | ○ |

F I G. 6

| solder powder: about 90wt% | flux : about 10wt% | | | | |
|---|---|---|---|---|---|
| | | | solvent | | |
| | activating agent | | base | thixotropy | solvent |
| composition | amine halide : diethylamine chlroride | organic acid : adipic acid | abietic acid dehydroabietic acid α-terpineol | cured castor oil | 2-methyl-2,4-pentadiol |
| Sn-Bi-In | | | | | |
| Sn-Bi-In-Ag | | | | | |

FIG. 7

| solder powder: about 80~95wt% | flux: about 15~20 wt% | | | |
|---|---|---|---|---|
| | | solvent | | |
| composition | activating agent | base | thixotropy | solvent |
| Sn91.7-Ag 3.3-Bi5 | amine halide: diethylamine halide ------- organic acid: adipic acid | abietic acid dehydroabietic acid α-terpineol | cured castor oil | 2-methyl-2,4-pentadiol |
| Sn86.9-Ag 3.1-Bi10 | amine halide: diethylamine halide ------- organic acid: adipic acid | | | |
| Sn77.2-Ag 2.8-Bi20 | amine halide: diethylamine halide ------- organic acid: adipic acid | | | |
| Sn67.6-Ag 2.4-Bi30 | amine halide: diethylamine halide ------- organic acid: adipic acid | | | |

FIG. 11

| | test piece preparation | | | tensile strength (kg/mm²) | elongation (%) | time-to-failure (min) | fracture type | *surface | texture |
|---|---|---|---|---|---|---|---|---|---|
| | mold temperature (°C) | cooling | cooling rate (°C/min) | | | | | | |
| ex 5-1 | 200 | natural cooling | 7.850 | 6.144(n=3) | 33.67(n=3) | 28.34 | brittle | scale | fine, homogeneous |
| ex 5-2 | 100 | natural cooling | 80.045 | 6.053(n=3) | 137.50(n=2) | 91.62 | ductile | none | coarse Sn texture |
| ex 5-3 | 25 | natural cooling | 904.002 | 4.969(n=3) | 218.33(n=2) | 118.84 | ductile | none | coarse Sn texture |
| ex 5-4 | 200 | water | 79.428 | 5.117(n=3) | 135.0 (**) | 89.48 | ductile | none | coarse Sn texture |
| ex 5-5 | 200 | gradual | 0.794 | 6.527(n=3) | 20.44(n=3) | 19.55 | brittle | scale | coarse, homogeneous |

*Sn42-Bi58 generally shows a scale pattern.
**extrapolation due to too large elongation.

FIG. 12

| sample # | peak load (kg) | break load (kg) | tensile strength (kg/mm²) | elongation (mm) | elongation (%) | time-to-failure (min) |
|---|---|---|---|---|---|---|
| 1 | 249.8 | 8.268 | 6.245 | 41.1 | 37.00 | 30.54 |
| 2 | 245.8 | 8.913 | 6.145 | 39.2 | 30.67 | 26.52 |
| 3 | 241.7 | 7.732 | 6.043 | 40.0 | 33.33 | 27.96 |
| average | 247.77 | 8.304 | 6.144 | 40.10 | 33.67 | 28.34 |

FIG. 13

| sample # | peak load (kg) | break load (kg) | tensile strength (kg/mm²) | elongation (mm) | elongation (%) | time-to-failure (min) |
|---|---|---|---|---|---|---|
| 1 | 249.8 | 8.779 | 6.223 | out of range | | 81.20 |
| 2 | 239.2 | — | 5.980 | 69.5 | 131.67 | 95.66 |
| 3 | 238.3 | — | 5.958 | 73.0 | 143.33 | 98.00 |
| average | 242.13 | 8.779 | 6.053 | 71.25 | 137.50 | 91.62 |

F I G. 14

| sample # | peak load (kg) | break load (kg) | tensile strength (kg/mm²) | elongation (mm) | elongation (%) | time-to-failure (min) |
|---|---|---|---|---|---|---|
| 1 | 199.5 | — | 4.988 | 81.0 | 170.00 | 115.40 |
| 2 | 198.8 | 8.832 | 4.970 | out of range | | 60.40 |
| 3 | 198.0 | — | 4.950 | 110.0 | 266.67 | 180.72 |
| average | 198.77 | 8.832 | 4.969 | 95.50 | 218.33 | 118.84 |

FIG. 15

| sample # | peak load (kg) | break load (kg) | tensile strength (kg/mm²) | elongation (mm) | elongation (%) | time-to-failure (min) |
|---|---|---|---|---|---|---|
| 1 | 208.9 | — | 5.223 | out of range | | 91.02 |
| 2 | 193.4 | — | 4.835 | out of range | | 82.16 |
| 3 | 211.7 | — | 5.293 | out of range | | 95.26 |
| average | 204.67 | | 5.117 | prediction⇒ | 135.00 | 89.48 |

FIG. 16

| sample # | peak load (kg) | break load (kg) | tensile strength (kg/mm²) | elongation (mm) | elongation (%) | time-to-failure (min) |
|---|---|---|---|---|---|---|
| 1 | 262.0 | 139.0 | 6.550 | 35.8 | 19.33 | 16.92 |
| 2 | 263.8 | — | 6.595 | 37.4 | 24.67 | 24.70 |
| 3 | 257.4 | 104.8 | 6.435 | 35.2 | 17.33 | 17.04 |
| average | 261.07 | 121.5 | 6.527 | 36.13 | 20.44 | 19.55 | ex 5-2 ex 5-4

LEAD-FREE SOLDER COMPOSITION WITH BI, IN AND SN

BACKGROUND OF THE INVENTION

The present invention generally relates to manufacturing of electric and electronic apparatuses and more particularly to a solder alloy of various forms used for soldering electric and electronic components, as well as to a soldering process and further to a rig used for such a soldering process. In particular, the present invention relates to a lead-free solder alloy that contains no substantial amount of lead (Pb).

Solder alloys are characterized by low melting temperatures and provide excellent electric as well as mechanical properties. Thus, solder alloys of various forms, including solder powders and solder pastes, are used for mounting electronic components on a printed circuit board.

Meanwhile, conventional solder alloys contain Pb. As Pb is toxic against biological bodies, it has been necessary to take precautionary measure when conducting such a soldering process, while such a precautionary measure increases the cost of the products produced as a result of the soldering. Thus, there is a demand for a lead-free solder alloy that is suitable for use in various soldering processes including automated soldering process.

In the automated soldering process of electronic components, several types of solder alloys are used conventionally. A representative example is a solder alloy known as Sn63-Pb37, wherein the solder alloy contains 63 wt % of Sn and 37 wt % of Pb. This material causes an eutectic melting at a melting temperature of 183° C. Another typical example is a solder alloy known as Sn62-Pb36-Ag2, wherein the solder alloy contains 62 wt % of Sn, 36 wt % of Pb and 2 wt % of Ag. The solder alloy forms an eutectic system characterized by a melting temperature of 179° C. As these solder alloys have low melting temperatures and provide excellent mechanical properties in terms of tensile strength and elongation as well as excellent electrical properties such as low resistance, they are used extensively for various automated soldering processes.

Meanwhile, there is a tendency of increasing public regulations against the use of Pb in view of human health and in view of environmental protection. Under such circumstances, various efforts have been made for developing a substitute solder alloy that is free from Pb.

As the material for use in assembling electric and electronic apparatuses, such a substitute solder alloy is required to have a low melting temperature such that the soldered electric or electronic component experiences little degradation of performance caused by the heat at the time of soldering. Further, such a substitute solder alloy should have an excellent mechanical strength comparable to that of a conventional solder alloy that contains Pb.

SUMMARY OF THE INVENTION

Accordingly, it is a general object of the present invention to provide a novel and useful solder alloy of various forms as well as a soldering process wherein the foregoing problems are eliminated.

Another and more specific object of the present invention is to provide a solder alloy free from Pb and still having a sufficiently low melting temperature, high conductivity and high mechanical strength.

Another object of the present invention is to provide a lead-free solder alloy composition comprising Sn, Bi and In, said solder alloy containing Sn, Bi and In with respective concentrations set such that said lead-free solder alloy composition has a melting temperature lower than a predetermined heat-resistant temperature of a work to be soldered.

Another object of the present invention is to provide a method for soldering a work, comprising the steps of:

reflowing a lead-free solder alloy containing therein Sn, Bi and In with respective contents set such that said solder alloy has a melting temperature lower than a predetermined heat-resistant temperature of said work, said step of reflowing including a step of heating said solder alloy to a temperature higher than said melting temperature; and cooling said work at a part where a soldering has been made to solidify said lead-free solder alloy.

Another object of the present invention is to provide a lead-free solder alloy composition containing: Bi with a concentration not exceeding 60.0 wt %; In with a concentration not exceeding 50.0 wt %; one or more elements selected from a group consisting of Ag, Zn, Ge, Ga, Sb and P, with a concentration equal to or larger than 1.0 wt % but lower than 5.0 wt %; and Sn as a balancing component of said lead-free solder alloy.

Another object of the present invention is to provide a soldering process of a work, comprising the steps of:

reflowing a lead-free solder alloy containing therein: Bi with a concentration not exceeding 60.0 wt %; In with a concentration not exceeding 50.0 wt %; one or more elements selected from a group consisting of Ag, Zn, Ge, Ga, Sb and P, with a concentration equal to or larger than 1.0 wt % but lower than 5.0 wt %; and Sn as a remaining component of said solder alloy; and cooling said work at a part where a soldering is made to solidify said lead-free solder alloy.

Another object of the present invention is to provide a lead-free solder alloy composition containing Sn, Ag and Bi, with respective concentrations set such that said lead-free solder alloy has a melting temperature lower than a predetermined heat-resistant temperature of a work to be soldered.

Another object of the present invention is to provide a method of soldering a work, comprising the step of:

reflowing a lead-free solder alloy containing therein Sn, Ag and Bi with respective contents set such that said lead-free solder alloy has a melting temperature lower than a predetermined heats-resistant temperature of said work, said step of reflowing including a step of heating said lead-free solder alloy to a temperature higher than said melting temperature; and cooling said work at a part where a soldering is made to solidify said lead-free solder alloy.

Another object of the present invention is to provide a lead-free solder powder comprising:

a plurality of lead-free solder particles each having a generally spherical shape with a diameter of 20–60 μm;

each of said lead-free solder particles containing Sn, Bi and In, with respective concentrations set such that said lead-free solder particle has a melting temperature lower than a predetermined heat-resistant temperature of a work to be soldered.

Another object of the present invention is to provide a lead-free solder powder comprising:

a plurality of lead-free solder particles each having a generally spherical shape with a diameter of 20–60 μm;

each of said lead-free solder particles containing Bi with a concentration not exceeding 60.0 wt %; In with a concentration not exceeding 50.0 wt %; one or more elements selected from a group consisting of Ag, Zn, Ge, Ga, Sb and P, with a concentration equal to or larger than 1.0 wt % but lower than 5.0 wt %; and Sn as a remaining component of said lead-free solder particle.

Another object of the present invention is to provide a lead-free solder powder comprising:

a plurality of lead-free solder particles each having a generally spherical shape with a diameter of 20–60 μm; each of said lead-free solder particles containing Sn, Ag and Bi, with respective concentrations set such that said lead-free solder alloy has a melting temperature lower than a predetermined heat-resistant temperature of a work to be soldered.

Another object of the present invention is to provide lead-free solder paste, comprising:

a lead-free solder powder comprising a plurality of lead-free solder particles each having a generally spherical shape with a diameter of 20–60 μm; each of said lead-free solder particles containing Sn, Bi and In, with respective concentrations set such that said lead-free solder particle has a melting temperature lower than a predetermined heat-resistant temperature of a work to be soldered, said solder powder being contained with a proportion of 80.0–95.0 wt %; and a mixture of an amine halide, a polyhydric alcohol and a polymer, with a proportion of 20.0–5.0 wt %.

Another object of the present invention is to provide a lead-free solder paste, comprising:

a lead-free solder powder comprising a plurality of lead-free solder particles each having a generally spherical shape with a diameter of 20–60 μm; each of said lead-free solder particles containing Bi with a concentration not exceeding 60.0 wt %; In with a concentration not exceeding 50.0 wt %; one or more elements selected from a group consisting of Ag, Zn, Ge, Ga, Sb and P, with a concentration equal to or larger than 1.0 wtt but lower than 5.0 wt %; and Sn as a remaining component of said solder alloy; said lead-free solder powder being contained with a proportion of 80.0–95.0 wt %; and a mixture of an amine halide, a polyhydric alcohol and a polymer, with a proportion of 20.0–5.0 wt %.

Another object of the present invention is to provide a lead-free solder paste, comprising:

a lead free solder powder comprising a plurality of lead-free solder particles each having a generally spherical shape with a diameter of 20–60 μm; each of said lead-free solder particles containing Sn, Ag and Bi, with respective concentrations set such that said lead-free solder particle has a melting temperature lower than a predetermined heat-resistant temperature of a work to be soldered; and a mixture of an amine halide, a polyhydric alcohol and a polymer, with a proportion of 20.0–5.0 wt %.

Another object of the present invention is to provide a lead-free solder paste, comprising:

a lead-free solder powder comprising a plurality of lead-free solder particles each having a generally spherical shape with a diameter of 20–60 μm; each of said lead-free solder particles containing Sn, Bi and In, with respective concentrations set such that said lead-free solder powder has a melting temperature lower than a predetermined heat-resistant temperature of a work to be soldered, said lead-free solder powder being contained with a proportion of 80.0–95.0 wt %; and a mixture of an organic acid, a polyhydric alcohol and a polymer, with a proportion of 20.0–5.0 wt %.

Another object of the present invention is to provide a lead-free solder paste, comprising:

a lead-free solder powder comprising a plurality of lead-free solder particles each having a generally spherical shape with a diameter of 20–60 μm; each of said lead-free solder particles containing Bi with a concentration not exceeding 60.0 wt %; In with a concentration not exceeding 50.0 wt %; one or more elements selected from a group consisting of Ag, Zn, Ge, Ga, Sb and P, with a concentration equal to or larger than 1.0 wt % but lower than 5.0 wt %; and Sn as a remaining component of said solder alloy; said lead-free solder powder being contained with a proportion of 80.0–95.0 wt %; and a mixture of an organic acid, a polyhydric alcohol and a polymer, with a proportion of 20.0–5.0 wt %.

Another object of the present invention is to provide a lead-free solder paste, comprising:

a lead-free solder powder comprising a plurality of lead-free solder particles each having a generally spherical shape with a diameter of 20–60 μm; each of said lead-free solder particles containing Sn, Ag and Bi, with respective concentrations set such that said lead-free solder alloy has a melting temperature lower than a predetermined heat-resistant temperature of a work to be soldered; and a mixture of an organic acid, a polyhydric alcohol and a polymer, with a proportion of 20.0–5.0 wt %.

Another object of the present invention is to provide a printed circuit board, comprising:

a substrate;

a conductor pattern provided on said substrate; and a lead-free solder alloy covering said conductor pattern, said lead-free solder alloy containing Sn, Bi and In, with respective concentrations set such that lead-free said solder alloy has a melting temperature lower than a predetermined heat-resistant temperature of a component to be soldered upon said substrate.

Another object of the present invention is to provide printed circuit board, comprising:

a substrate;

a conductor pattern provided on said substrate; and a lead-free solder alloy covering said conductor pattern, said lead-free solder alloy containing: Bi with a concentration not exceeding 60.0 wt %; In with a concentration not exceeding 50.0 wt %; one or more elements selected from a group consisting of Ag, Zn, Ge, Ga, Sb and P, with a concentration equal to or larger than 1.0 wt % but lower than 5.0 wt %; and Sn as a remaining component of said lead-free solder alloy.

Another object of the present invention is to provide a printed circuit board, comprising:

a substrate;

a conductor pattern provided on said substrate; and a lead-free solder alloy covering said conductor pattern, said lead-free solder alloy containing: Sn, Ag and Bi, with respective concentrations set such that said lead-free solder alloy has a melting temperature lower than a predetermined heat-resistant temperature of a component to be soldered upon said substrate.

Another object of the present invention is to provide an electronic component, comprising:

an electronic component body;

an electrode projecting from said electronic component body; and a lead-free solder alloy covering said electrode, said lead-free solder alloy containing Sn, Bi and In, with respective concentrations set such that said lead-free solder alloy has a melting temperature lower than a predetermined heat-resistant temperature of said electronic component.

Another object of the present invention is to provide an electronic component, comprising:
an electronic component body;
an electrode projecting from said electronic component body; and
a lead-free solder alloy covering said electrode, said lead-free solder alloy containing: Bi with a concentration not exceeding 60.0 wt %; In with a concentration not exceeding 50.0 wt %; one or more elements selected from a group consisting of Ag, Zn, Ge, Ga, Sb and P, with a concentration equal to or larger than 1.0 wt % but lower than 5.0 wt %; and Sn as a remaining component of said lead-free solder alloy.

Another object of the present invention is to provide an electronic component, comprising:
an electronic component body;
an electrode projecting from said electronic component body; and
a lead-free solder alloy covering said conductor pattern, said lead-free solder alloy containing: Sn, Ag and Bi, with respective concentrations set such that said lead-free solder alloy has a melting temperature lower than a predetermined heat-resistant temperature of a component to be soldered upon said substrate.

Another object of the present invention is to provide an electronic apparatus, comprising:
a substrate;
a conductor pattern provided on said substrate;
an electronic component mounted upon said substrate in electrical connection with said conductor pattern, said electronic component having an electrode projecting therefrom; and
a lead-free solder alloy connecting said electrode to said conductor pattern, said lead-free solder alloy containing Sn, Bi and In, with respective concentrations set such that said lead-free solder alloy has a melting temperature lower than a predetermined heat-resistant temperature of said electronic component.

Another object of the present invention is to provide an electronic apparatus, comprising:
a substrate;
a conductor pattern provided on said substrate;
an electronic component mounted upon said substrate in electrical connection with said conductor pattern, said electronic component having an electrode projecting therefrom; and
a lead-free solder alloy connecting said electrode to said conductor pattern, said lead-free solder alloy containing: Bi with a concentration not exceeding 60.0 wt %; In with a concentration not exceeding 50.0 wt %; one or more elements selected from a group consisting of Ag, Zn, Ge, Ga, Sb and P, with a concentration equal to or larger than 1.0 wt % but lower than 5.0 wt %; and Sn as a remaining component of said lead-free solder alloy.

Another object of the present invention is to provide an electronic apparatus, comprising:
a substrate;
a conductor pattern provided on said substrate;
an electronic component mounted upon said substrate in electrical connection with said conductor pattern, said electronic component having an electrode projecting therefrom; and
a lead-free solder alloy connecting said electrode to said conductor pattern, said lead-free solder alloy containing Sn, Ag and Bi, with respective concentrations set such that said lead-free solder alloy has a melting temperature lower than a predetermined heat-resistant temperature of said electronic component.

Another object of the present invention is to provide a soldering rig for soldering a work, comprising:
soldering unit for soldering a work by causing a reflow of a lead-free solder; and
a cooling unit for cooling said work at a part where a soldering has been made, to solidify said lead-free solder.

According to the present invention as set forth above, one can obtain a solder alloy free from Pb while maintaining excellent mechanical strength in the solidified solder alloy. Thereby, the problem of hazard to biological bodies as well as the problem of environmental pollution are successfully eliminated. Further, by optimizing the composition of the solder alloy, it is possible to reduce the melting temperature of the solder alloy lower than a melting temperature of a conventional solder alloy that contains Pb, while maintaining sufficient mechanical strength. Thereby, the damage applied to the work or electronic component as a result of soldering is educed. Associated with the reduced temperature of soldering, the preparation of the work for soldering is substantially simplified, and the cost of the work is also reduced by using less expensive materials. By cooling the solder alloy rapidly, it is possible to maximize the elongation of the solidified solder alloy.

Other objects and further features of the present invention will become apparent from the following detailed description when read in conjunction with the attached drawings.

BRIEF DESCRIPTION OF THE DRAWINGS

FIG. 1 is a diagram summarizing the effect of In added to a solder alloy of a Sn—Bi eutectic system in the form of a table;

FIG. 2 is a diagram summarizing the effect of Bi added to a solder alloy of a Sn—Bi—In ternary syst in the form of a table;

FIG. 3 is a diagram summarizing the effect of various elements added to a solder alloy of a Sn—B—In ternary system in the form of a table;

FIG. 4 is a diagram summarizing the effect of Bi added to a solder alloy of a Sn—Ag eutectic system in the from of a table;

FIG. 6 is a diagram showing the composition of a lead-free solder paste according to another embodiment of the present invention in the form of a table;

FIG. 7 is a diagram showing the composition of a lead-free solder paste according to other embodiment of the present invention in the form of a table;

FIG. 11 is a diagram showing the mechanical property of the lead-free alloy of various embodiments of the present invention in the form of a table;

FIG. 12 is a diagram showing the detailed experimental result conducted for a sample included in FIG. 11, in the form of a table;

FIG. 13 is a diagram showing the detailed experimental result conducted for another sample included in FIG. 11, in the form of a table;

FIG. 14 is a diagram showing the detailed experimental result conducted for other sample included FIG. 11, in the form of a table;

FIG. 15 is a diagram showing the detailed experimental result conducted for other sample included in FIG. 11, in the form of a table;

FIG. 16 is a diagram showing the detailed experimental result conducted for other sample included in FIG. 11, in the form of a table;

DETAILED DESCRIPTION OF PREFERRED EMBODIMENTS

Figure 5A:
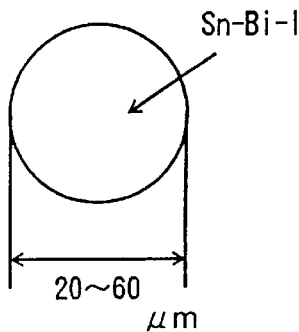
FIGS. 5A–5I are diagrams showing a particle of a lead-free solder powder according to an embodiment of the present invention.

Hereinafter, the present invention will be described with reference to the preferred embodiments.

In the present invention, the inventor has conducted a series of experiments to prepare various solder alloys free from Pb and to examine the properties thereof. As a result, it has been discovered that a lead-free solder alloy containing Sn, Bi and In as well as a lead-free solder alloy containing Sn, Ag and Bi, show mechanical as well as electrical properties comparable or even superior to those of the conventional solder alloy that contains Pb.

Thus, the inventor of the present invention has conducted detailed experiments on the lead-free solder alloy containing Sn, Bi and In as well as on the lead-free solder alloy containing Sn, Ag and Bi in search of the optimum composition of the solder alloy. Further, experiments have been conducted also on the alloys in which other metal or non-metal elements are added.

First, a description will be made on the experiments about the solder alloy of the Sn—B—In ternary system with reference to FIGS. 1 and 2, wherein FIGS. 1 and 2 are tables that summarize the result of the experiments on the tensile strength, percentage of elongation, time-to-failure, fracture surface morphology and the melting temperature for various compositions of the solder alloy. Further, FIG. 3 shows a table summarizing the result of the similar experiments conducted for solder alloys in which other metal as well as non-metal elements are added.

Before going to the evaluation of the experimental results, explanation will be made on the testing process and testing apparatuses used in the experiments.

In the experiments, standard test pieces prescribed in the JIS (Japanese Industrial Standard) were produced from solder alloys of various compositions, and the test pieces thus produced were subjected to a tensile test for mechanical properties such as tensile strength, percentage of elongation, time-to-failure and fracture surface observation. Further, the melting temperature of the solder alloy was measured by using a thermocouple.

More specifically, the test pieces were produced according to the JIS type 7 prescription for tensile tests. The test piece thus produced had a cross sectional area of 40 mm$^2$ and a gauge length of 30 mm. The test pieces were prepared by melting an alloy of Sn, Bi and In or an alloy containing further impurity elements in a furnace held at 400° C., wherein the molten solder alloy thus prepared was poured into a mold carrying therein a cavity with a shape corresponding to the JIS type 7 test piece prescription.

In the tensile test, a test rig of Instron Model 4206 was used. The test piece was set on the rig, and the test was conducted by pulling the test piece with a fixed rate of 0.5 mm/min while recording the tensile load and the elongation of the test piece. Upon occurrence of the failure, the tensile strength and the percentage of elongation were calculated based upon the record. Further, a discrimination was made whether the fracture was a ductile one or brittle one based upon the observation of the fracture surface morphology.

The measurement of the melting temperature or liquidus temperature of the solder alloy, on the other hand, was made by causing a melting of the solder alloy, followed by a natural cooling. During the process of natural cooling, the temperature profile was measured by means of a thermocouple inserted into the molten solder alloy.

As already noted, FIGS. 1 through 3 summarize the result of the test in terms of the tensile strength, elongation, time-to-failure, fracture surface and the melting temperature. When the properties observed were satisfactory for a solder alloy, an open circle mark was given as an indication of positive evaluation. When the properties were unsatisfactory, on the other hand, a cross mark was given as an indication of negative evaluation. In the present test, the evaluation was made based upon a standard that: (1) the solder alloy should have a tensile strength of at least 2 kg/mma; (2) the solder alloy should have an elongation of at least 30 %; and (3) the solder alloy should have a melting temperature equal to or lower than 155° C.

Referring to FIG. 1, it will be noted that the content of In is changed variously in the ternary alloy of the Sn—B—In system while maintaining the content of Bi generally constant. As will be noted in FIG. 1, the solder alloy provides a satisfactory tensile strength as long as the In content in the alloy is less than 50 wt %. When the In content exceeds 50 wt % as in the case of the comparative examples 3 and 4, on the other hand, the solder alloy fails to provide a satisfactory tensile strength. About the elongation, it should be noted that the solder alloy containing In with a content less than 0.5 wt % as in the case of the comparative examples 1 and 2 does not provide a satisfactory result, while the solder alloy containing In with a content of 0.5 wt % or more provides a satisfactory result.

About the melting temperature, all of the test samples in FIGS. 1–3 satisfy the requirement that the melting temperature should be lower than 155° C. It should be noted that electronic components are generally designed to have a heat-resistant temperature of 183° C. in view of use of conventional solder alloy that contains Pb. By using the solder alloy of the present invention, on the other hand, it is possible to conduct the soldering process at a temperature lower than the temperature used conventionally, and the problem of thermal damage to the electronic components is minimized. Further, it is possible to reduce the cost of the electronic apparatus by simplifying the preparation process of soldering as well as by using inexpensive materials for the electronic components.

It should be noted that FIG. 1 further shows a tendency that the melting temperature of the solder alloy decreases with increasing In content. In other words, FIG. 1 indicates that one can control the melting temperature of the solder alloy by controlling the In content. Thereby, any necessary change of the soldering temperature depending upon the electronic component such as a semiconductor device, is easily attended to.

With regard to the time-to-failure, it will be noted that no satisfactory result is obtained when the In content is less than 0.5 wt % as in the case of the comparative examples 1 and 2 or when the In content exceeds 50 wt % as in the case of the comparative example 3. It is noted that there is an exception in the case of the comparative example 4 in which the time-to-failure falls in the satisfactory range of 40–60 minutes even when the In content exceeds 50 wt %. It is believed that this exception is caused because of the Bi-free composition of the solder alloy that has resulted in an increase of the time-to-failure.

With regard to the fracture surface of the tested samples, it is noted that a brittle fracture occurs when the In content of the solder alloy is less than 5.0 wt %. When the In content is equal to or larger than 5.0 wt %, a ductile fracture occurs. While the type of fracture of the solder alloy may not affect the property thereof as a solder, it is more preferable that the solder alloy shows ductile fracture than brittle fracture in view point of the mechanical strength.

Summarizing the result of FIG. 1, it is concluded that one can obtain a solder alloy of desirable property by incorporating In into a solder alloy of the Sn—Bi eutectic system with a proportion of 0.5 wt % or more but less than 50.0 wt %. In FIG. 1, the samples 1-1–1-5 provide such desirable properties.

In the sample 1-5, it should be noted that, while the tensile strength is slightly larger than the acceptable lower limit, the solder alloy provides a much larger elongation over other samples as well as comparative examples cited in the table of FIG. 1. Thus, by setting the composition of the solder alloy such that the solder alloy contains Sn with a proportion of about 34.0 wt %, Bi with a proportion of about 46.0 wt % and In with a proportion of about 20.0 wt %, it is possible to obtain a solder alloy having an excellent elongation. Such a solder alloy composition is particularly suitable for soldering components upon a flexible substrate where the solder alloy experiences large deformation.

In the description above, the representation of the composition such as "about 34.0 wt %," "about 20.0 wt %" and the like, is used, in view of possible error in the composition of the solder alloy that can reach as much as ±1 wt % for Sn and Bi and ±0.1 wt % for In.

Next, the result of FIG. 2 will be explained. As already noted, FIG. 2 shows the properties of various solder alloys all included in the ternary eutectic system of Sn—B—In but with various Bi contents and a generally common In content.

Referring to FIG. 2, it will be noted that a satisfactory tensile strength is obtained when the Bi content has exceeds 5.0 wt %. About the elongation, no satisfactory result is obtained when the Bi content is equal to or larger than 60.0 wt % as in the case of the comparative examples 12–15, while the solder alloy containing Bi with a proportion less than 60.0 wt % provides a satisfactory elongation. About the melting temperature, all of the solder alloy compositions, except for the example in which the Bi content is 100%, satisfy the requirement. In other words, it is demonstrated that the melting temperature or liquidus temperature is reduced in the solder alloy that contains Sn, Bi and In.

The result of FIG. 2 further indicates the tendency that the melting temperature increases with increasing Bi content. Thus, by adjusting the Bi content, it is possible to control the melting temperature of the solder alloy.

About the time-to-failure, it will be noted that the solder alloys containing Bi with less than 5.0 wt %, as in the comparative examples 10 and 11, as well as the solder alloys containing Bi with 60.0 wt % or more, as in the case of the comparative experiments 12–15, provide a reduced time-to-failure and hence an unsatisfactory durability. Further, the observation of the fracture surface indicates that the solder alloy shows a ductile fracture when the Bi content is less than 55.0 wt %, while the fracture becomes brittle when the Bi content in the solder alloy is equal to or larger than 55.0 wt %.

Summarizing the result of FIG. 2, it is concluded that a solder alloy suitable for soldering electric and electronic components is obtained by adding Bi to a solder alloy of the Sn-In eutectic system, with a proportion that exceeds 5.0 wt % but smaller than 60.0 wt % as in case of the examples 2-1 and 2-2 of FIG. 2.

Further, the results of FIGS. 1 and 2 collectively indicate that a solder alloy suitable for soldering electric and electronic components is obtained by setting the Bi content to be less than 60.0 wt %, the In content less than 50.0 wt %, and by balancing the rest of the solder alloy by Sn. Particularly, one obtains a solder alloy of optimum composition by setting the Sn content to about 40.0 wt %, the Bi content to about 55.0 wt %, and the In content to about 5.0 wt %. As already noted, the phrase "about" is used in view of the possible error in the composition when forming the alloy. The error can be as large as ±1 wt % for Sn and Bi and ±0.1 wt % for In.

Next, a description will be made on the experiments conducted by the inventor with reference to FIG. 3, wherein FIG. 3 shows the result of the experiments conducted upon a solder alloy based upon the Sn—B—In eutectic system, except that other metal elements, particularly Ag and Zn, are added to the foregoing ternary system.

It will be noted that the solder alloy does not satisfy the requirement about elongation when Ag and Zn are added to the solder alloy of the Sn—B—In ternary eutectic system with a proportion of 5.0 wt % or more for each of Ag and Zn. On the other hand, when the proportion of one of Ag and Zn is set to 1.0 wt %, the requirement for elongation is satisfied.

Further, it will be noted in FIG. 3 that all of the samples satisfy the requirement about melting temperature. The result of FIG. 3 indicates that one can reduce the melting temperature and hence the liquidus temperature by incorporating Ag and Zn to the ternary solder ally of the Sn—B—In eutectic system.

The result of FIG. 3 clearly indicates that the solder alloy containing Ag and Zn with a proportion of 1.0 wt % or more but below 5.0 wtt, such as the examples 3-1 and 3-2, satisfies the requirement imposed upon a solder alloy, with every respect of the requirement. Further, it should be noted that the content of Bi and In in FIG. 3 falls in the optimum range derived from the result of FIGS. 1 and 2. In other words, the content of Bi does not exceed 60.0 wt % and the content of In does not exceed 50.0 wt %.

Summarizing the result of FIG. 3, a solder alloy suitable for soldering is obtained from a ternary alloy of the Bi—In—Sn eutectic system by setting the proportion of Bi and In such that the Bi content does not exceed 60.0 wt %, the In content does not exceed 50.0 wt % and by incorporating Ag or Zn with a proportion equal to or larger than 1.0 wt % but smaller than 5.0 wt %. The rest of the alloy composition is balanced by Sn. In the embodiment of FIG. 3, it should be noted that other metal elements such as Ge or Ga may be used in place of Ag and Zn. Further, non-metal elements such as P may also be used for this purpose.

In the ternary alloy composition of the Sn—Bi—In eutectic system shown in FIG. 3, it is also possible to incorporate Sb as an additional metal element. By adding Sb, the problem of elemental diffusion to a Sn—Pb plating is successfully eliminated. When Pb and Bi are contacted with each other, there tends to occur a problem of diffusion, which in turn results in a bulging or coming-off of the solder metal. Thereby, the reliability of the soldering deteriorates significantly. In the lead-free solder alloy of the present invention, such a problem of degradation of the solder alloy is successfully eliminated by incorporating Sn as noted above. Thereby, it is preferable to control the Sn content in the solder alloy to fall in the range of 1.0–5.0 wt %. The Sn content is optimized in this range in view of the tensile strength and the elongation of the solder alloy.

Next, a solder alloy of the Sn—Ag—Bi system will be described with reference to FIG. 4 that shows the result of the test conducted upon the tensile strength, elongation, time-to-failure, fracture surface morphology and the melting temperature for the solder alloy of various compositions. As the tests conducted upon the solder alloys of FIG. 4 are identical with the tests described already, further description thereof will be omitted. Similarly to FIGS. 1–3, FIG. 4 cites the evaluation about the tensile strength, elongation, time-to-fracture and the melting temperature. When the evaluation is positive, a designation is made by an open circle mark. When the evaluation is negative, on the other hand, a designation is made by a cross mark.

In the test of FIGS. 4, a standard is imposed such that a satisfactory solder alloy should have a tensile strength of 7 kg/mm$^2$ or more, an elongation of 7.0% or more and a melting temperature of 220° C. or less. It will be noted that this standard is different from the standard applied to the solder alloy containing Sn, Bi and In. The reason of using a such different standard is to meet the demand for a solder alloy having a particularly large tensile strength. Such a demand on the other hand does not require a high elongation as in the case of the foregoing solder alloy of the Sn—B—In system.

Referring to FIG. 4, the table shows the properties of the ternary solder alloy of the Sn—Ag—Bi eutectic system for various contents of Bi while maintaining the Ag content substantially constant.

From the result of FIG. 4, it will be noted that the solder alloy of the examples 4-1–4-6 satisfies the foregoing standard. On the other hand, the comparative example 30 that contains Pb has a lower tensile strength and does not satisfy the foregoing standard, contrary to the ternary alloy of the Sn—Ag—Bi system. A similar result was obtained also for the example 31 for the binary alloy of the Sn—Bi eutectic system and for the example 32 for the binary alloy of the Sn—Ag eutectic system.

About the observed elongation, all of the examples of FIG. 4 satisfy the required standard. It is known that the elongation and the tensile strength tend to contradict with each other. Thus, there is a tendency that an alloy having a large tensile strength shows a small elongation. Under such circumstances, the solder alloy of the present embodiment provides a particularly high tensile strength while sacrificing the elongation. For example, the samples 4-1–4-6 shows a tensile strength higher than that of the comparative examples 30–32 and an elongation smaller than that of the comparative examples 30–32.

With regard to the melting temperature, all of the examples shown in the table of FIG. 4 satisfy the required standard. Particularly, the examples 4-1-4-6 show a melting temperature falling in the range of 139° C.–220° C. It has been practiced, in the conventional lead-containing solder alloys, to adjust the composition of the alloy such that the melting temperature is held low in view of the endurable temperature of 18° C. of the electronic components to be soldered. On the other hand, there also are demands for a solder alloy composition having a higher melting temperature such as 220° C. or more. In order to meet such a demand, there exist a group of solder alloys in which the melting temperature is adjusted higher than 220° C. According to the present embodiment as set forth in the table of FIG. 4, one can provide a lead-free solder alloy that is suitable for the purpose while simultaneously maintaining a sufficient tensile strength.

With regard to the time-to-failure, there is a tendency that the time-to-failure increases with increasing elongation. Thus, the examples 4-1-4-6 provide a relatively small time-to-failure value as compared with the comparative examples 30–32. Even then, the solder alloys of the examples 4-1-4-6 provides a satisfactory time-to-failure of 230–670 seconds while maintaining a large tensile strength.

With regard to the fracture surface, the solder alloy of the present embodiment shows a feature of brittle fracture. As the solder alloy of the present embodiment is intended to provide a high tensile strength, the evidence that the solder alloy shows a brittle fracture does not cause any serious consequence.

Summarizing the result of FIG. 4, it will be noted that the ternary solder alloy of the Sn—Ag—Bi system provides a superior tensile strength over the eutectic solder alloys of other compositions described previously such as the examples 30–32, as clearly demonstrated in the examples 4-1-4-6. Further, it is possible to adjust the melting temperature as desired within the temperature range conventionally used for soldering. Thus, it is possible to carry out the soldering at various temperatures optimized for the components to be soldered while simultaneously maintaining a high tensile strength, by selecting the composition of the lead-free solder alloy according to the purpose.

In the examples 4-1–4-6 of FIG. 4, it should be noted that the ratio of the Sn wt % to the Ag wt % is held constant and only the Bi content is changed. In other words, the solder alloy composition of the examples 4-1-4-6 is represented as 96.5×(100–X)/100 for Sn, 3.5×(100–X)/100 for Ag, and X for Bi, all represented in terms of wt %.

From FIG. 4, it is concluded that the following compositions are suitable for the solder alloy having a large tensile strength: a solder alloy containing Ag with an amount not exceeding 4.0 wt %, Bi with an amount equal to or larger than 1.0 wt %, and Sn with an amount not exceeding 5.0 wt %; a solder alloy containing Ag with an amount between 1.0 wt % and 4.0 wt %, Bi with an amount between 1.0 wt % and 40.0 wt %, and Sn with an amount between 55.0 wt % and 95.0 wt %, a solder alloy containing Ag with an amount of approximately 3.3 wt %, Bi with an amount of approximately 5.0 wt %, and Sn with an amount of approximately 91.7 wt %; a solder alloy containing Ag with an amount of approximately 3.1 wt %, Bi with an amount of approximately 10.0 wt %, and Sn with an amount of approximately 86.9 wt %; a solder alloy containing Ag with an amount of 3.0 wt %, Bi with an amount of 15.0 wt %, and Sn with an amount of 82.0 wt %; a solder alloy containing Ag with an amount of 2.8 wt %, Bi with an amount of 20.0 wt %, and Sn with an amount of 77.2 wt %; a solder alloy containing Ag with an amount of 2.4 wt %, Bi with an amount of 30.0 wt %, and Sn with an amount of 67.6 wt %; a solder alloy containing Ag with an amount of 2.1 wt %, Bi with an amount of 40.0 wt %, and Sn with an amount of 57.9 wt %, and the like.

FIGS. 5A–5I are diagrams showing the examples of solder particles forming a solder powder.

Figure 5B:
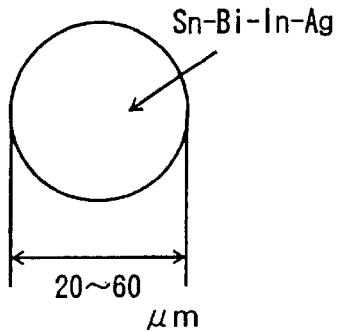
Figure 5C:
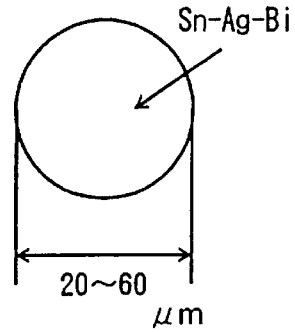

Referring to FIG. 5A, the solder alloy of the examples 1-1–1-5 shown in FIG. 1 or the solder alloy of the examples 2-1 or 2-2 of FIG. 2, is used to form a generally spherical solder particle having a diameter of 20–60 μm. FIG. 5B, on the other hand, shows a solder particle formed of the solder alloy of the example 3-1 or 3-2 of FIG. 3, wherein the solder particle has a generally spherical form and a diameter of 20–60 μm. Further, FIG. 5C shows a solder particle formed of the solder alloy of the examples 4-1 –4-6 of FIG. 4, wherein the solder particle has a generally spherical form and a diameter of 20–60 μm.

Figure 5D:
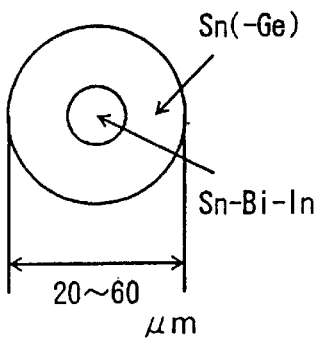

FIG. 5D, on the other hand, shows a composite solder particle, in which a core particle, formed of the solder alloy of any of the examples 1-1–1-5 of FIG. 1 or 2-1–2-2 of FIG. 2, is covered by Sn or an alloy of Sn containing Ge with a proportion of 0.1–5.0 wt %, wherein the composite solder particle as a hole has a generally spherical form and a diameter of 20 –60 ∞m.

Figure 5E:
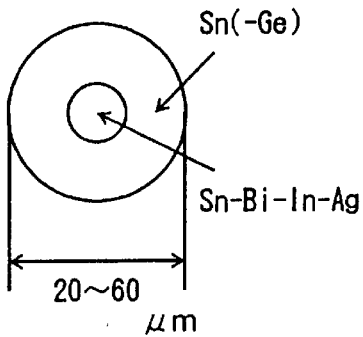

FIG. 5E, on the other hand, shows another composite solder particle, in which a core particle, formed of the solder alloy of any of the examples 3-1 and 3-2 of FIG. 3, is covered by a similar alloy that contains Sn or Ge further with a proportion of 0.1–5.0 wt %, wherein the composite solder particle as a whole has a generally spherical form and a diameter of 20–60 μm.

Figure 5F:
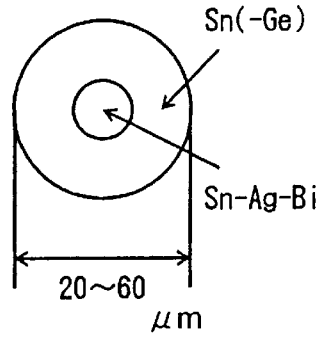

Further, FIG. 5F shows another composite solder particle, in which a core particle of the solder alloy of any of the examples 4-1–4-6 of FIG. 4, is covered by a similar alloy that contains Sn or Ge further with a proportion of 0.1–5.0 wt %, wherein the composite solder particle as a whole has a generally spherical form and a diameter of 20–60 μm.

Figure 5G:
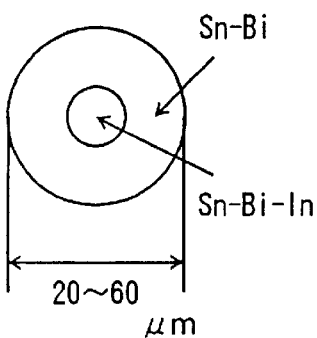

FIG. 5G shows another composite solder particle, in which a core particle of the solder alloy of any of the examples 1-1–1-5 of FIG. 1 or the examples 2-1 and 2-2 of FIG. 2 is covered by a similar alloy containing Sn and Bi with respective proportions exceeding 20.0 wt % and less than 60.0 wt %, wherein the composite solder particle as a whole has a generally spherical form and a diameter of 20–60 μm.

Figure 5H:
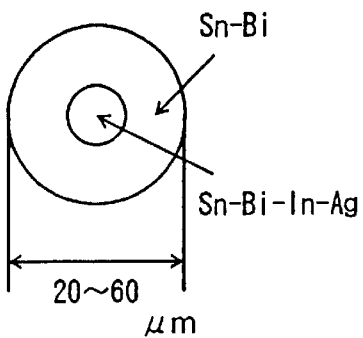

FIG. 5H shows a still other composite solder particle, in which a core particle of the solder alloy of any of the examples 3-1 and 3-2 of FIG. 3 is covered by a similar alloy that contains Sn and Bi with respective proportions exceeding 20.0 wt % and less than 60.0 wt %, wherein the composite solder particle as a whole has a generally spherical form and a diameter of 20–60 μm.

Figure 5I:
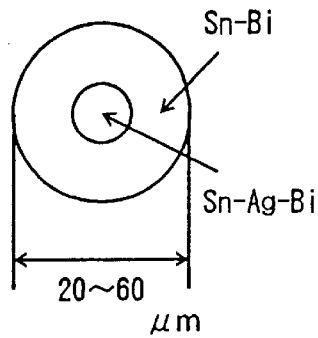

FIG. 5I shows a still other composite solder particle, in which a core particle of the solder alloy of any of the examples 4-1–4-6 of FIG. 4 is covered by a similar alloy containing Sn and Bi with respective proportions exceeding 20.0 wt % and less than 60.0 wt %, wherein the composite solder particle as a whole has a generally spherical form and a diameter of 20–60 μm.

In any of the embodiments in FIGS. 5A–5I, it is possible to form a solder paste from the solder powder formed of the solder particles. Further, in the embodiments of FIGS. 5D–5I, it is possible to eliminate the problem of oxidation of the solder alloy by covering the solder alloy by an alloy containing Sn or Ge with a proportion of 0.1–0.5 wt % or by an alloy containing Sn and Bi with the proportion of Sn exceeding 20.0 wt % and the proportion of Bi not exceeding 60.0 wt %.

Hereinafter, the solder paste that uses the solder powder of the previous embodiments will be described.

The inventor of the present invention has prepared various solder paste compositions, the first series of compositions being a mixture of a solder powder, an amine halide, a polyhydric alcohol and a polymer compound, wherein first series composition contains the solder powder with a proportion of 80.0–95.0 wt %. Thus, the solder paste composition of the first series contains, as the remaining component, the amine halide, the polyhydric alcohol and the polymer compound with a proportion of 20.0–5.0 wt %. The second series composition is a mixture of a solder powder, an organic acid, polyhydric alcohol and a polymer compound, wherein the second series composition contains the solder powder with a proportion of 80.0 wt %–95.0 wt %. Thus, the solder paste composition of the second series contains, as the remaining component, the organic acid, the polyhydric alcohol and the polymer compound with a proportion of 20.0–5.0 wt %.

As the amine halide for use in the solder paste, one may select one or more from the group of: acrylic amine hydrochloride, aniline hydrochloride, diethylamine hydrochloride, cyclohexylamine hydrochloride, monomethylamine hydrochloride, dimethylamine hydrochloride, trimethylamine hydrochloride, phenylhydrazine hydrochloride, n-butylamine hydrochloride, 0-methylhydrazine hydrochloride, ethylamine oxalate, cyclohexyl oxalate, 2-aminoethylbromide oxalate, and tri-n-butylamine oxalate.

As the organic acid for use in the solder paste, one may select one or more from the group of: oxalic acid, malonic acid, succinic acid, glutaric acid, adipic acid, pimelic acid, suberic acid, azelaic acid, sebacic acid, maleic acid, tartaric acid, benzoic acid, acetic acid, hydroxyacetic acid, propionic acid, butyric acid, n-veleric acid, n-caproic acid, enanthic acid, n-capric acid, lauric acid, myristic acid, palmitic acid, stearic acid, and the like.

FIG. 6 shows an example of the solder paste composition that uses a solder alloy described in one of the examples shown in FIGS. 1 through 3 as a solder powder, while FIG. 7 shows an example of the solder paste composition that uses a solder alloy described in one of the examples shown in FIG. 4.

It should be noted that the amine halides or organic acids described above act as an activating agent. Further, one may use abietic acid, dehydroabietic acid, α-terpineol, and the like, for the base of the paste. The solder paste may further contain a polymer compound such as cured castor oil as a thixotropic agent. Further, a polyhydric alcohol such as 2-methyl 2,4-pentadiol may be added as a solvent.

The solder paste composition described above is naturally free from Pb and can be used for a hazard-free reflowing process that does not require precautionary measure against toxicity of Pb. Thereby, the efficiency of production of the electronic apparatuses is improved.

Figure 8:
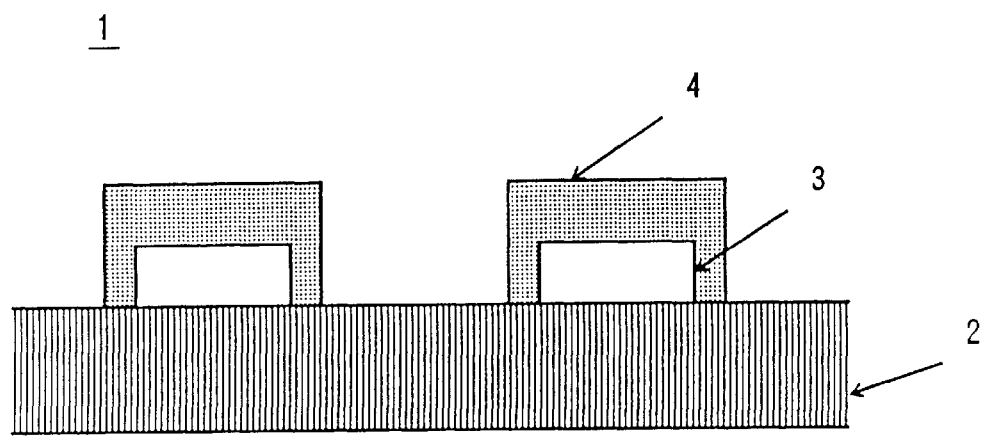
FIG. 8 is a diagram showing the construction of a printed circuit board according to still other embodiment of the present invention.

FIG. 8 shows an example of application of the lead-free solder alloy upon a conductor pattern on a printed circuit board.

Referring to FIG. 8, a printed circuit board 1 includes a base member 2 of a glass-epoxy, wherein the base member 2 carries thereon an electrode 3 of Cu for external connection. On the electrode 3, a lead-free solder alloy selected from any of the examples described in FIGS. 1–3 is applied, such that a film 4 of the solder alloy covers the electrode 3. It was confirmed that such a construction provides an excellent junction or adherence between the solder alloy and the electrode 3 of Cu, and the film of the solder alloy 4 covers the electrode 3 uniformly.

Figure 9:
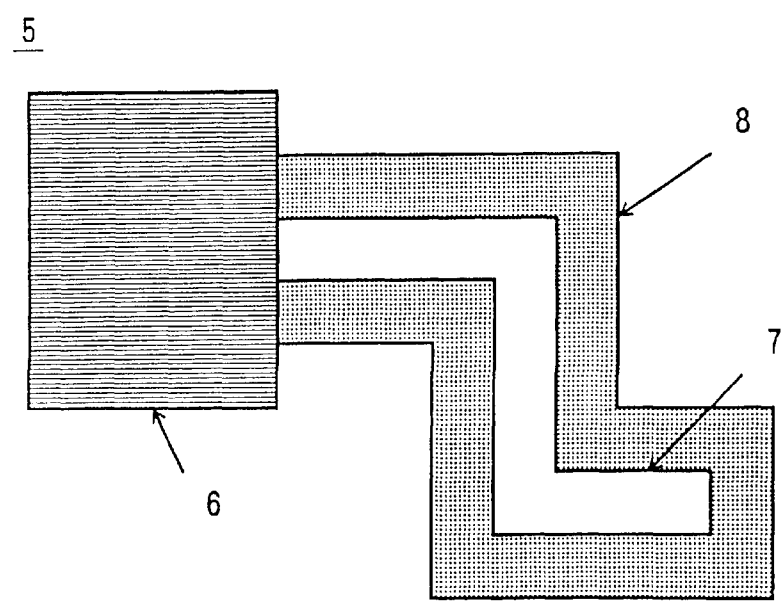
FIG. 9 is a diagram showing the construction of a printed circuit board according to still other embodiment of the present invention.

FIG. 9 shows an example in which the solder alloy is applied to coat a lead 7 of an electronic component 5 that may be a semiconductor device having a resin package body 6.

Referring to FIG. 9, the lead 7 may be formed of any of Cu, 42-alloy (containing Ni 42 wt %, Co 0.5 wt %, Mn 0.8 wt % and balancing Fe) and Covar, and the lead-free solder alloy of various compositions selected from the examples in FIGS. 1–3 covers the lead 7. It was confirmed that such a construction provides an excellent junction or adherence between the lead 7 and the solder alloy, and a solder alloy film 8 is formed on the lead 7 with a uniform thickness.

As described above, the lead-free solder alloy successfully coat the conductor patterns on the printed circuit board as well as the terminals of electronic components, and one can achieve a reliable electrical as well as mechanical connection between the electronic components and the printed circuit board.

Figure 10:
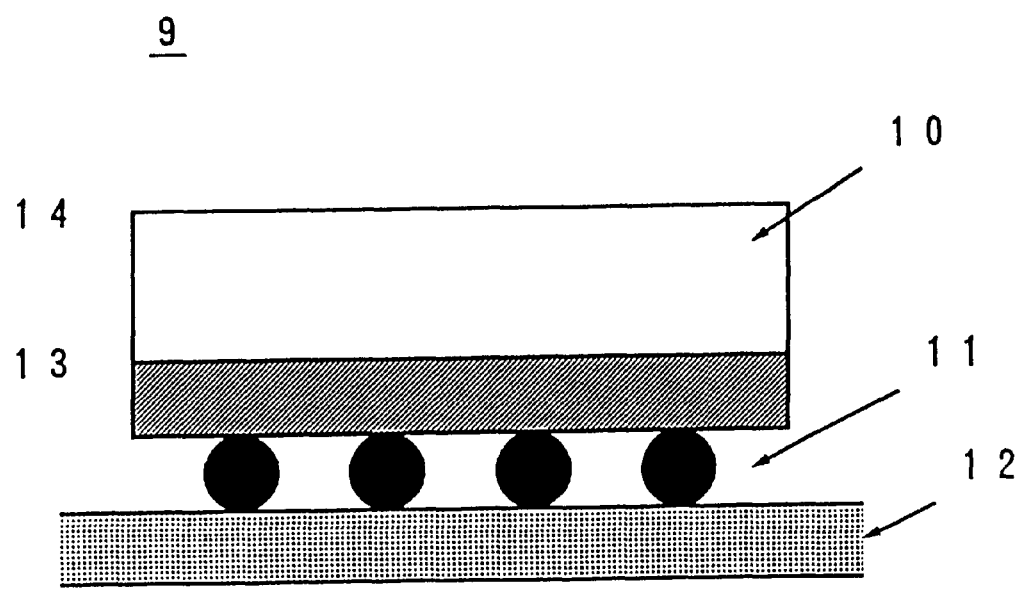
FIG. 10 is a diagram showing the construction of a semiconductor device mounted upon a printed circuit board according to still other embodiment of the present invention.

FIG. 10 shows an example of using the leadfree solder alloy of the present invention for the solder bumps that form an external connection terminal of an electronic apparatus such as a semiconductor device 9.

Referring to FIG. 10, the semiconductor device 9 includes a substrate 13 carrying thereon a semiconductor element not illustrated, wherein the semiconductor element is embedded in a resin package body 14 provided on the substrate 13. Further, the substrate 13 carries a plurality of solder bumps 11 on a lower major surface thereof for external connection. Upon placing the semiconductor device 9 on a printed circuit board 12, the solder bumps 11 engage with corresponding conductor patterns provided on the printed circuit board 12. Thus, there occurs a reflowing of the solder bumps 11 upon passage of the printed circuit board 12 through a furnace, and a reliable electrical as well as mechanical connection is achieved thereby according to the flip-chip process, without using a lead-containing solder alloy.

Next, the soldering process as well as the soldering rig developed for the lead-free solder alloy of the present invention will be described.

In the foregoing experimental result summarized in FIGS. 1–4, it will be noted that there are examples that show anomalously large elongation as in the case of the examples 1-5 of FIG. 1, 3-2 of FIG. 3 and 4-1 of FIG. 4. Further, it was rather frequently observed that the lead-free solder alloys containing Sn and Bi show a rather remarkable increase of elongation.

The inventor of the present invention at first attributed this effect to the effect of the impurities contained in the solder alloy. Thus, a chemical analysis was conducted upon the solder alloys that showed anomalous elongation by way of the XRF (X-ray fluorescent) analysis and by way of the induction plasma spectroscopy. The result of the chemical analysis, however, clearly showed that the solder alloy is essentially formed of Sn and Bi and that there is no substantial contamination of the solder alloy by a third element.

Based upon the result of the chemical analysis above, the inventor of the present invention has set a working hypothesis that the anomalous elongation occurs as a result of the process of preparing the test specimen, particularly the cooling rate when molding the test piece used for the test piece of the specimen.

Thus, the inventor has conducted a series of experiments to mold the test pieces with various cooling rates, and test the pieces thus formed were subjected to tests for various mechanical properties such as tensile strength, elongation, time-to-fracture, fracture surface observation as well as tests for various metallurgical properties such as the surface state and metallurgical texture. In the experiments, a binary eutectic alloy having a composition of 42.0 wt % for Sn and 58.0 wt % for Bi was used throughout.

When molding the test pieces, three different cooling processes, i.e., natural cooling process, water cooling process and gradual cooling process, were employed. In the natural cooling process, a molten alloy was left in the room temperature environment together with a mold. Thereby, test pieces 5-1–5-3 were obtained according to such a natural cooling process. In the water cooling process, the mold was cooled compulsorily by water after molding the test piece from the molten solder alloy. Thereby, a test piece 5-4 was obtained. In the gradual cooling process, the molten alloy in the mold was gradually cooled by holding the mold in a thermally insulated environment. Thereby, a test piece 5-5 is obtained.

By employing various cooling processes, the cooling rate of the solder alloy at the time of molding the test piece is changed variously. Particularly, the molding according to the natural cooling process is conducted by setting the mold at various initial temperatures such as 200° C. in the case of the example 5-1, 100° C. in the case of the example 5-2, and 25° C. in the case of the example 5-3.

In the results of FIG. 11, it should be noted that the mechanical properties shown in each of the examples represent the average of three measurements conducted upon three test pieces. Thereby, the effect of scattering of individual measurement is eliminated.

FIG. 12 shows the results of the measurement conducted upon the three test pieces for the example 5-1. Further, FIG. 13 shows the measurement conducted upon the three test pieces for the example 5-2, FIG. 14 shows the results of the measurement conducted upon the three test pieces for the example 5-3, FIG. 15 shows the results of the measurement conducted upon the three test pieces for the example 5-4, and FIG. 16 shows the results of the measurement conducted upon the three test pieces for the example 5-5.

Figure 17:
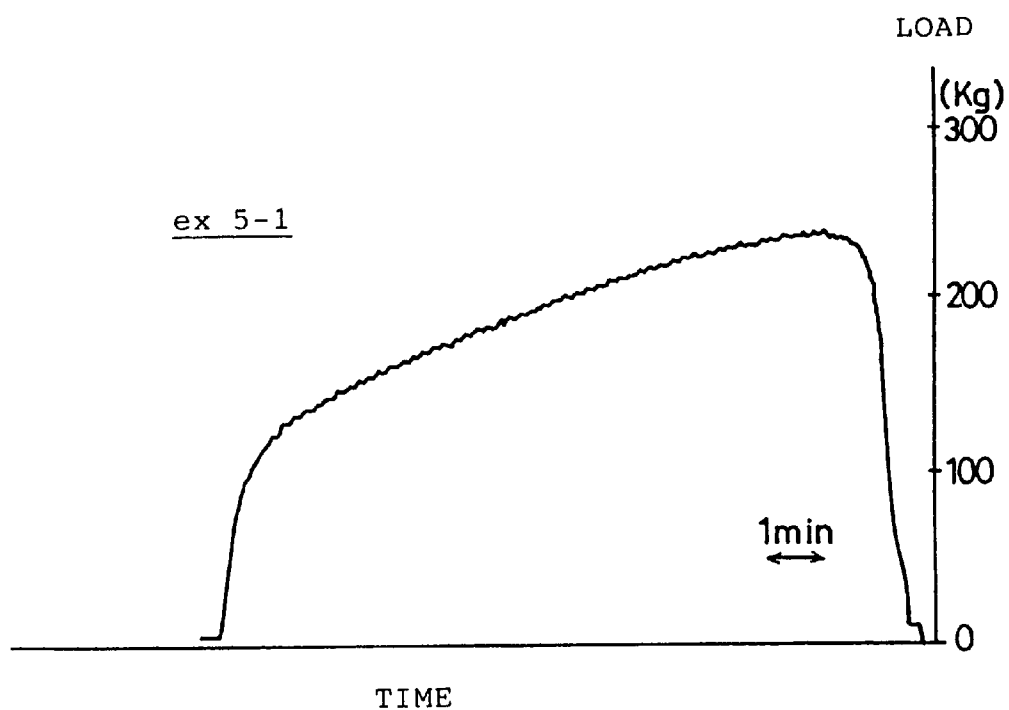
FIG. 17 is a diagram showing the relationship between elapsed time and the load for the sample of FIG. 12.
Figure 18:
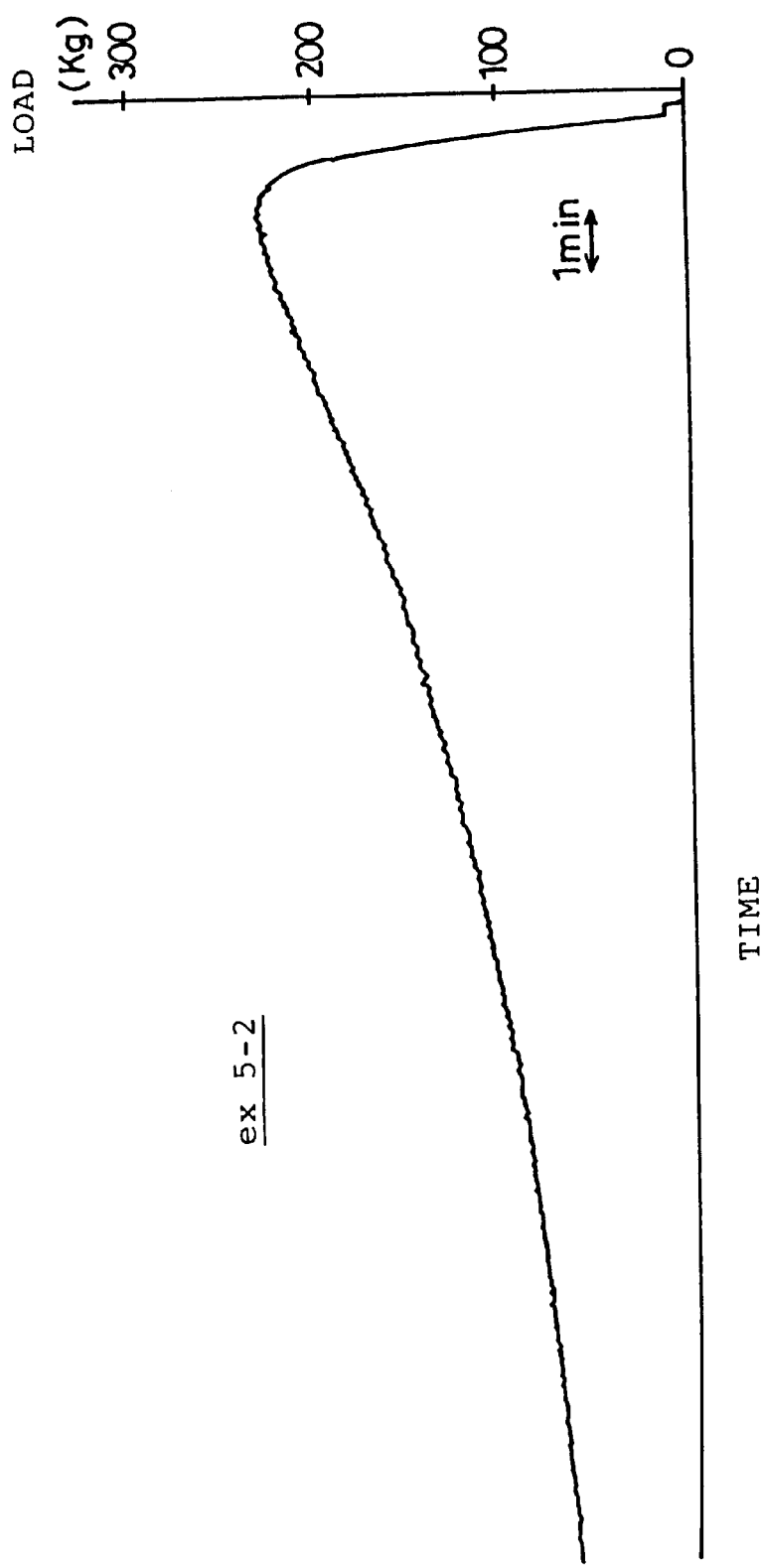
FIG. 18 is a diagram showing the relationship between elapsed time the load for the sample of FIG. 13.
Figure 19:
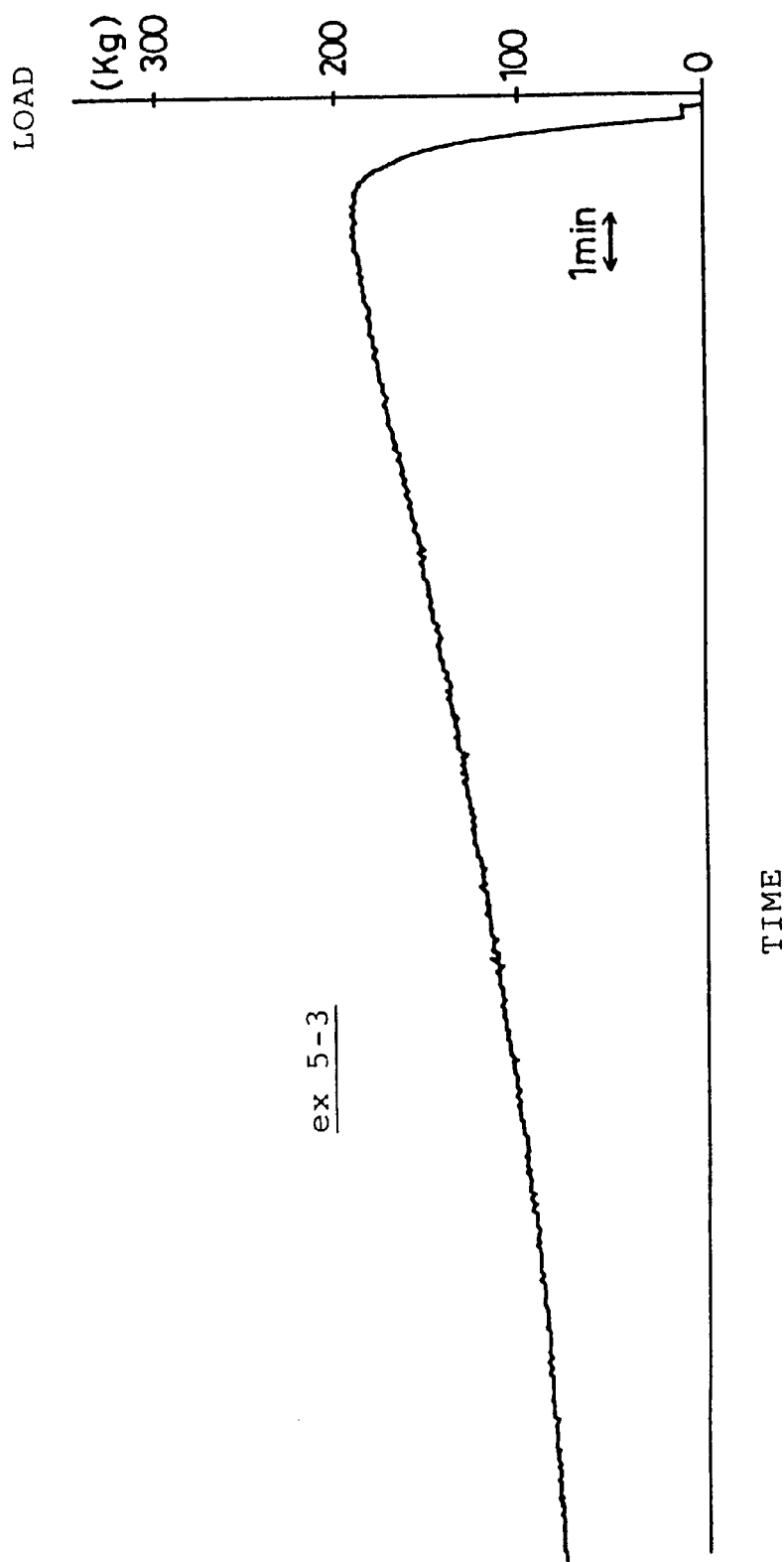
FIG. 19 is a diagram showing the relationship between elapsed time and the load for the sample of FIG. 14.
Figure 20:
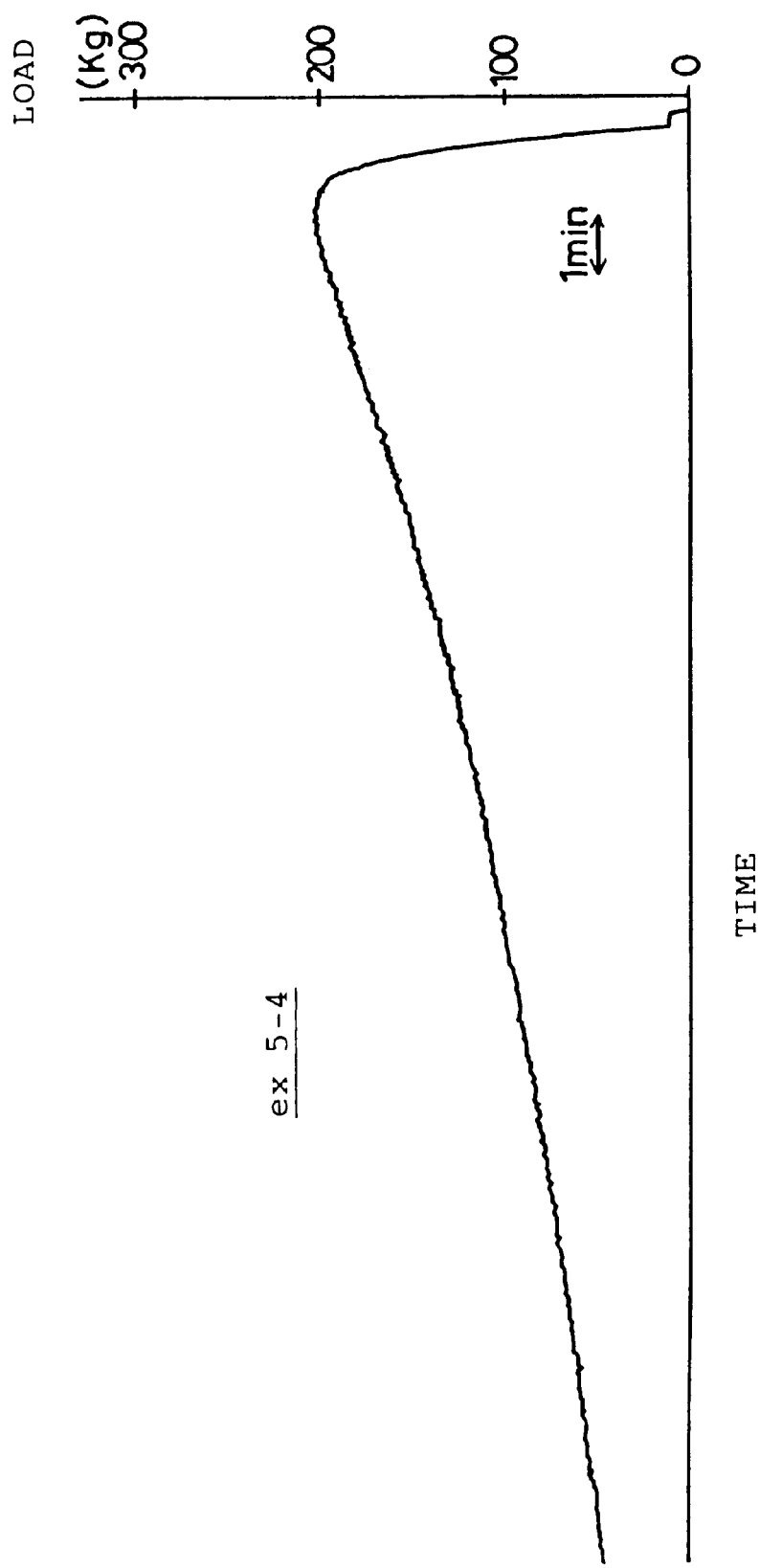
FIG. 20 is a diagram showing the relationship between elapsed time and the load for the sample of FIG. 15.
Figure 21:
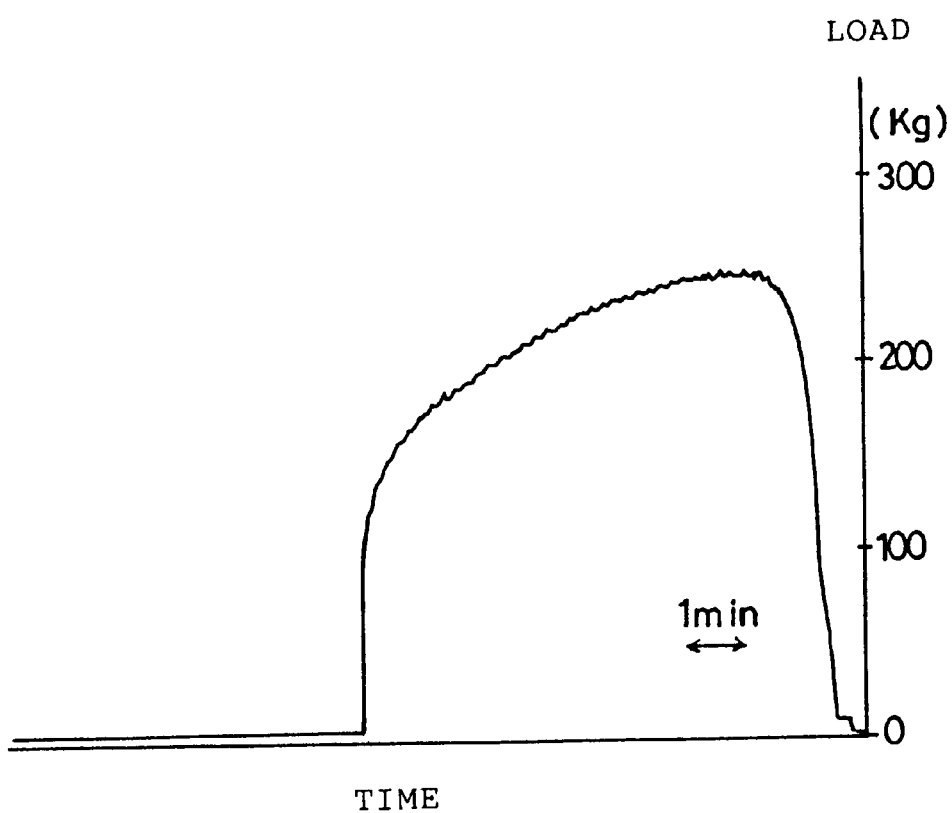
FIG. 21 is a diagram showing the relationship between elapsed time and the load for the sample of FIG. 16.

FIG. 17 shows the relationship between the load and elongation observed for the test piece of the example 5-1, wherein the relationship of FIG. 17 is for one of the three test pieces that has shown the result closest to the average. Similarly, FIG. 18 shows the relationship between the load and elongation observed for the test piece of the example 5-2, wherein the relationship of FIG. 18 is for one of the three test pieces that has shown the result closest to the average. FIG. 19 shows the relationship between the load and elongation observed for the test piece of the example 5-3, wherein the relationship of FIG. 19 is for one of the three test pieces that has shown the result closest to the average. FIG. 20 shows the relationship between the load and elongation observed for the test piece of the example 5-4, wherein the relationship of FIG. 20 is for one of the three test pieces that has shown the result closest to the average. Further, FIG. 21 shows the relationship between the load and elongation observed for the test piece of the example 5-5, wherein the relationship of FIG. 21 is for one of the three test pieces that has shown the result closest to the average.

Figure 22:
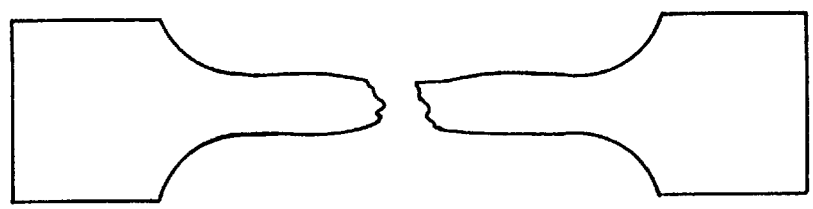
FIG. 22 is a diagram showing the state of fracture of the sample of FIG. 12.
Figure 23:
FIG. 23 is a diagram showing the state of fracture of the sample of FIG. 13.
Figure 24:
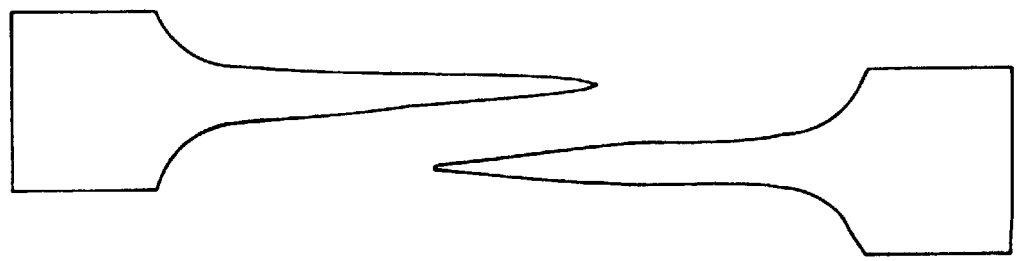
FIG. 24 is a diagram showing the state of fracture of the sample of FIG. 14.
Figure 25:
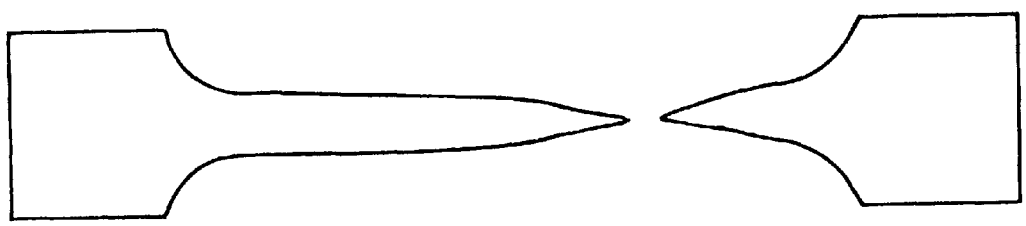
FIG. 25 is a diagram showing the state of fracture of the sample of FIG. 15.
Figure 26:
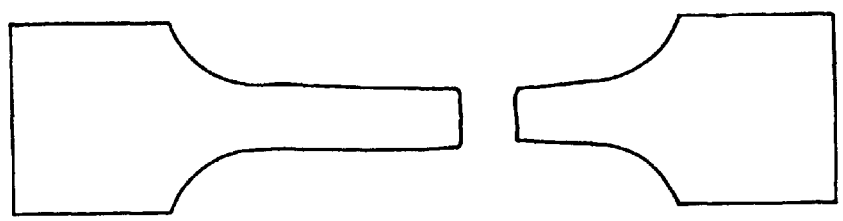
FIG. 26 is a diagram showing the state of fracture of the sample of FIG. 16.

FIG. 22 shows a representative state of fracture of the test piece for the example 5-1. Similarly, FIG. 23 shows a representative state of fracture of the test piece for the example 5-2. Further, FIG. 24 shows a representative state of fracture of the test piece for the example 5-3, FIG. 25 shows a representative state of fracture of the test piece for the example 5-4, and FIG. 26 shows a representative state of fracture of the test piece for the example 5-5.

It should be noted that FIG. 11 summarizes the foregoing experimental results in FIGS. 12–25.

Hereinafter, the relationship between the cooling condition and the mechanical property of the solder alloy will be described with reference to the experimental results shown in FIG. 11.

First, the effect of cooling process upon the mechanical property will be examined for the case where the mold temperature is set to 200° C., based upon the examples 5-1, 5-4 and 5-5.

Referring to FIG. 11, it is clearly indicated that the solder alloy provides the smallest elongation of 20.44% when the gradual cooling process is employed in which the cooling rate is minimum. With increasing cooling rate, the elongation increases such that an elongation of 33.67% is obtained as a result of the natural cooling process. When a water cooling is employed, an elongation of 89.48% is obtained. The foregoing results indicate that one obtains an increased elongation with increasing cooling rate.

Next, the effect of the mold temperature on the elongation will be explained based upon the examples 5-1–5-3 in which the natural cooling is used throughout but with various initial mold temperatures.

Referring to FIG. 11, it will be noted that the highest initial mold temperature of 200° C., which provides the smallest cooling rate, results in the smallest elongation of 33.67%, while the lower initial mold temperature of 100° C. provides an increased elongation of 137.50%. When the mold temperature is set to 25° C., it is possible to achieve an elongation of 218.33%. This result also supports the conclusion that the elongation increases with increasing cooling rate.

Summarizing the experimental results above, the mechanical properties of a solder alloy can change variously depending upon the cooling rate, even when the composition of the solder alloy is fixed. With increasing cooling rate, the elongation of the solder alloy increases, and the solder alloy shows the evidence of ductile fracture.

As will be noted in FIG. 11, the fracture surface of the test pieces that provide a large elongation, as in the case of the examples 5-2–5-4, do not exhibit a scale-like pattern that is typically observed in the fracture surface of an Sn42-Bi58 alloy cooled slowly. Further, the microscopic observation of the fracture surface indicates that there is a coarsening of texture in the examples 5-2–5-4. Thus, it is believed that such a coarsening is responsible for the increase of the elongation of the alloy.

As already noted, the remarkable increase of the elongation occurs not only in the solder alloy containing Sn and Bi, but also in the alloy of other compositions. Thus, it is believed that such an increase of the elongation results from the coarsening of texture of the alloy, caused by the large cooling rate.

It should be noted that such a solder alloy composition having a large elongation is particularly useful in flexible printed circuit boards in which the conductor patterns including the solder patterns experience deformation.

Hereinafter, a soldering process as well as a soldering rig that carries out such a soldering process will be described.

Figure 27:
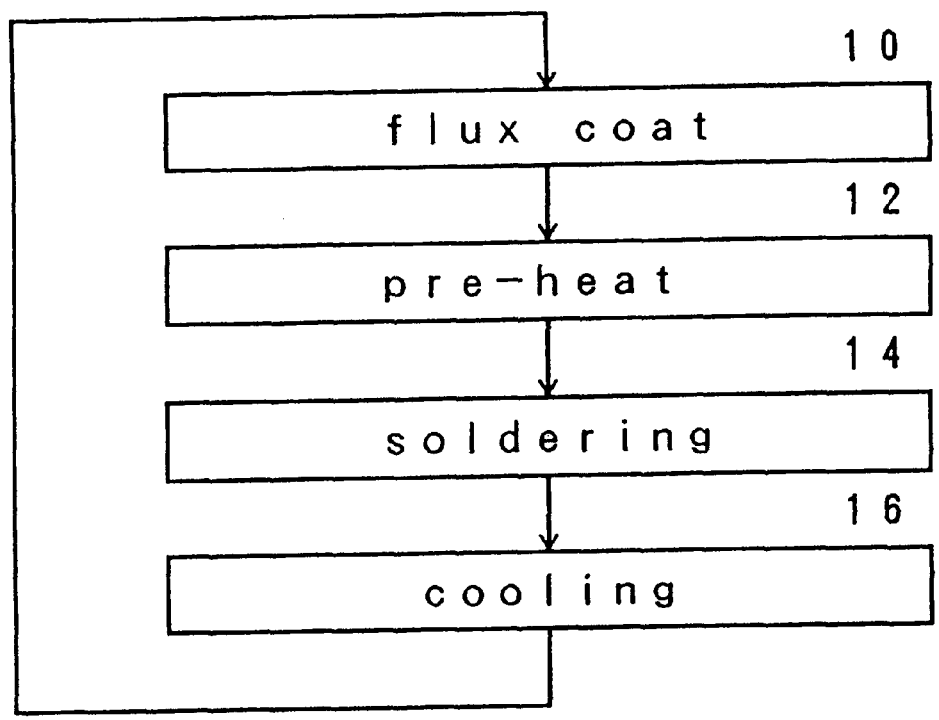
FIG. 27 is a diagram showing the soldering process according to still other embodiment of the present invention in the form of a flowchart.

FIG. 27 shows the soldering process that uses the lead-free solder alloy of any of the previous embodiments for soldering an electric or electronic component upon a substrate such as a printed circuit board. Of course, the substrate is not limited to the printed circuit board.

Referring to FIG. 27, a step 10 is conducted at first in which a flux is applied to the part of the printed circuit board on which the soldering is to be made. The flux is applied for improving the wetting by the solder alloy, wherein a suitable flux is selected in view of the composition of the lead-free solder alloy to be used.

Next, in the step 12, a preheating is conducted upon the printed circuit board for eliminating inhomogeneity of soldering caused by localized cooling and associated solidifying of the molten solder alloy.

Further, a step 14 is conducted subsequently, wherein the pre-heated printed circuit board is dipped in a bath of molten solder alloy of any of the foregoing compositions, and the molten alloy covers the exposed conductor pattern as well as the lead or electrode of the electric or electronic components. Thereby, the soldering is achieved. The steps 10–14 are substantially the same as the conventional soldering process that uses a lead-containing solder alloy.

Next, in the following step 16, the printed circuit board is pulled up from the solder bath and cooled by suitable external cooling means, such that the solder alloy experiences a rapid cooling or quenching. As a result of such a rapid cooling, the solder alloy shows an improved elongation as explained already. As the external cooling means, one may employ a jet of cooling medium such as a coolant gas or volatile organic solvent. Such a jet of cooling medium can be applied selectively to the part where the soldering has just been made.

Figure 28:
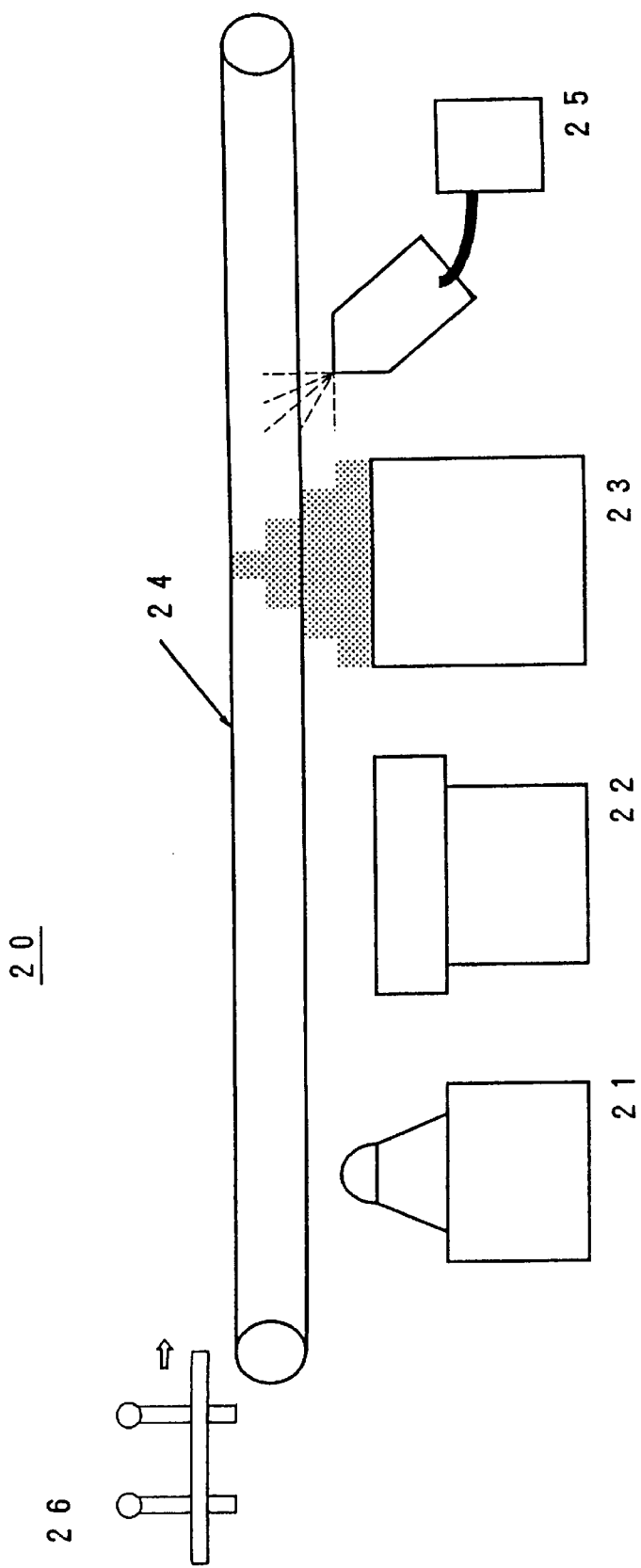
FIG. 28 is a diagram showing a soldering rig according to a still other embodiment of the present invention.

FIG. 28 shows the construction of a soldering rig 20 according to an embodiment of the present invention for conducting the soldering process of FIG. 27. It should be noted that the soldering rig 20 is designed primarily to carry out a soldering of a sheet-like or plate-like object such as a printed circuit board. However, the soldering rig is by no means limited to such a soldering of printed circuit boards but is applicable to various soldering processes.

Referring to FIG. 27, it will be noted that the soldering rig 20 includes a flux coating unit 21, a pre-heating unit 22, a soldering unit 23, a transport conveyer 24 and a cooling unit 25 that characterizes the rig 20 of the present invention, each of which will be explained below.

The transport conveyer 24 carries a printed circuit board 26 placed thereon and transports the same in a direction indicated by an arrow. Further, the flux coating unit 21, the pre-heating unit 22, the soldering unit 23 and the cooling unit 25 are disposed consecutively along the transport conveyer 24 in the transport direction of the conveyer 24.

Thus, the flux coating unit 21 applies a flux upon the printed circuit board 26 and the pre-heating unit 22 preheats the printed circuit board 26 thus applied with the flux. Further, the soldering unit 23 carries out the soldering by means of the lead-free solder alloy described previously.

After the soldering, the printed circuit board 26 is forwarded to the cooling unit 25 by the transport conveyer 24. Thereby, the cooling unit 25 rapidly cools the high temperature solder alloy applied by the soldering unit 23. As a result of such a rapid cooling, it is possible to increase the elongation of the solidified solder alloy as explained already.

Figure 29:
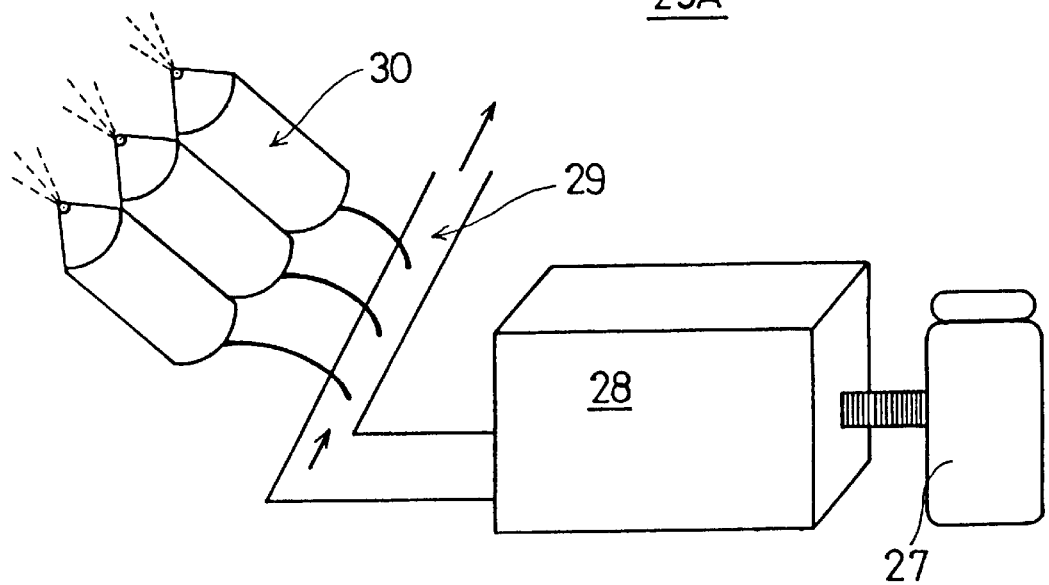
FIG. 29 is a diagram showing the construction of a cooling unit of the soldering rig of FIG. 28.
Figure 30:
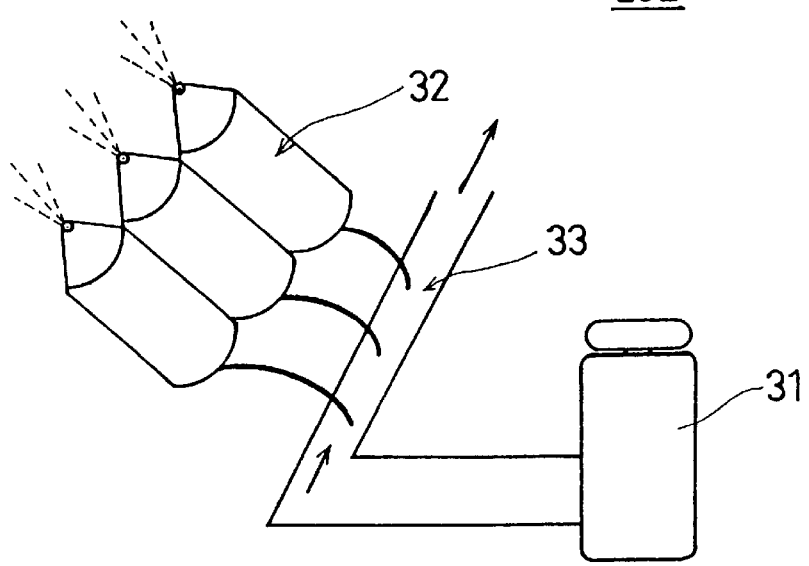
FIG. 30 is a diagram showing the construction of another cooling unit of the soldering rig of FIG. 28.
Figure 31:
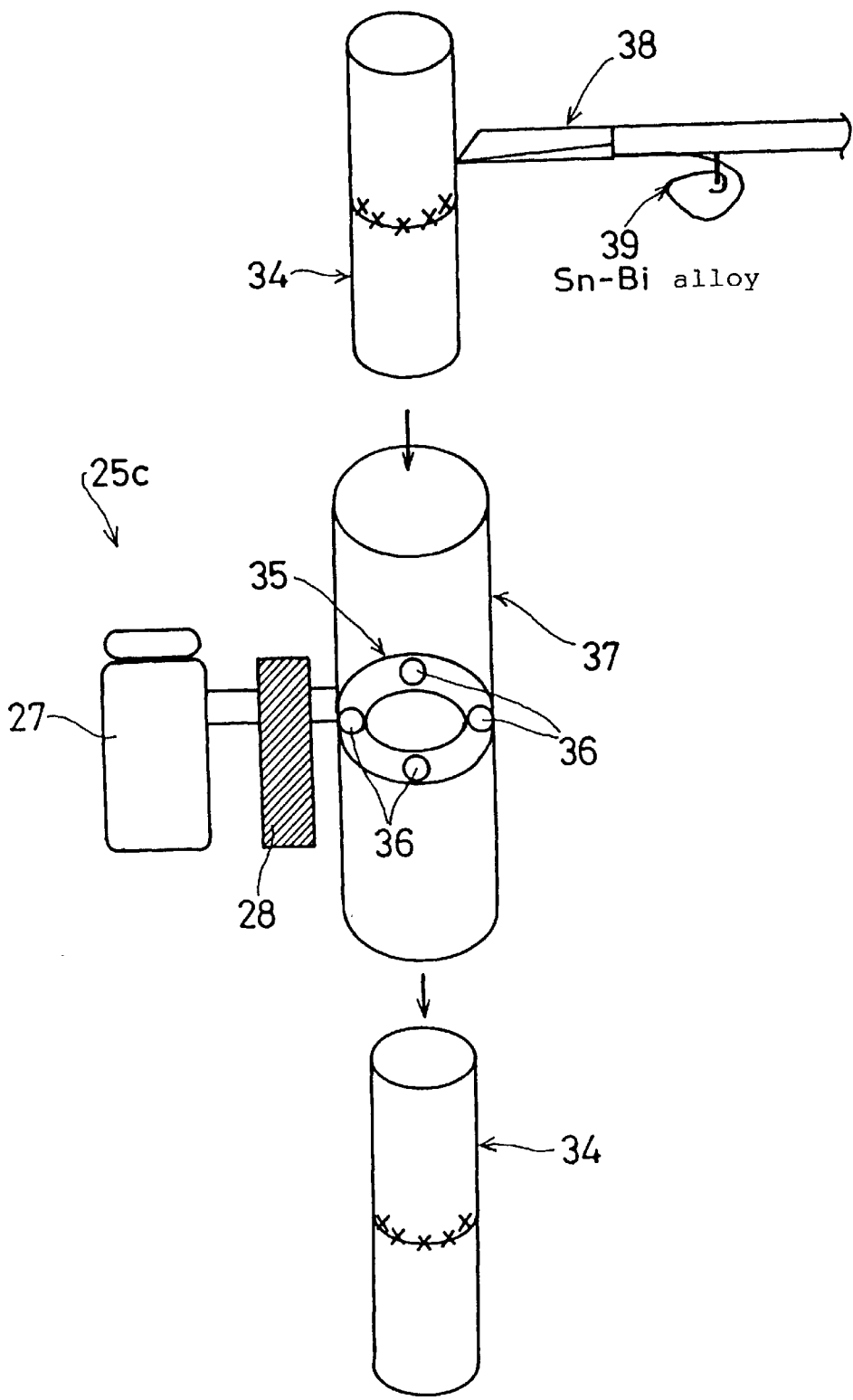
FIG. 31 is a diagram showing the construction of still other cooling unit of the soldering rig of FIG. 28.

FIGS. 29–31 show the construction of the cooling unit 25.

Referring to FIG. 29 showing an example 25A of the cooling unit 25 that uses liquid nitrogen as a cooling medium, the cooling unit 25A includes a tank 27 for containing liquid nitrogen wherein the liquid nitrogen in the tank 27 is supplied to an evaporator 28 that evaporates the liquid nitrogen and forms a low temperature nitrogen gas. The low temperature nitrogen gas thus formed, in turn, is supplied along a pipe 29 to which one or more gas nozzles 30 are connected. Thereby, the low temperature nitrogen is injected upon the location of soldering on the printed circuit board for cooling the high temperature solder alloy.

FIG. 30 shows another example 25B of the cooling unit 25, wherein the cooling unit 25B uses a volatile freon gas as a cooling medium.

Referring to FIG. 30, the cooling unit 25B includes a tank 31 of freon to which a supply pipe 33 of freon is connected. Further, one or more nozzles 32 are connected to the pipe 33 for injecting the freon upon the printed circuit board 26 on the conveyer 24 at the location where the soldering has just been made. Thereby, the high temperature solder alloy experiences a rapid cooling upon the evaporation of freon.

FIG. 31 shows another example 25C of the cooling unit 25 that is designed to cool a cylindrical or tubular object after soldering. As the cooling unit 25C of FIG. 31 employs the construction of FIG. 29, those parts corresponding to the parts shown in FIGS. 29 are designated by the same reference numerals and the description thereof will be omitted.

Referring to FIG. 31, the cooling unit 25C includes an annular nozzle element 35 in which a plurality of nozzles 36 are provided. The nozzle element 35 is disposed in a tube 37 adapted for passing a cylindrical object 34 that has experienced soldering, for example by means of a soldering iron 38 that uses a lead-free solder alloy 39 of the Sn—Bi eutectic system. Thereby, the object 34 is cooled upon passage through an inner space of the annular nozzle element 35. As the nozzles 36 are disposed with a generally uniform interval on the nozzle element 35, the seam of the cylindrical object 34 where the soldering has been made, experiences a uniform cooling by the low temperature nitrogen gas injected from the nozzles 36.

Further, the present invention is by no means limited to the embodiments described heretofore, but various variations and modifications may be made without departing from the scope of the invention.

What is claimed is:

1. A lead-free solder alloy composition comprising Sn, Bi and In, said solder alloy containing Sn, Bi and In with respective concentrations set such that said lead-free solder alloy composition has a melting temperature lower than a predetermined heat-resistant temperature of a work to be soldered, wherein said solder alloy composition contains Bi with an amount of approximately 55.0 wt %, In with an amount of approximately 5.0 wt %, and Sn with an amount of about 40.0 wt %.

2. A lead-free solder alloy composition comprising Sn, Bi and In, said solder alloy containing Sn, Bi, and In with respective concentrations set such that said lead-free solder alloy composition has a melting temperature lower than a predetermined heat-resistant temperature of a work to be soldered, wherein said solder alloy composition contains Bi with an amount of approximately 46.0 wt %, In with an amount of approximately 20.0 wt %, and Sn with an amount of approximately 34.0 wt %.

3. A lead-free solder powder comprising:

a plurality of lead-free solder particles each having a generally spherical shape with a diameter of 20–60 μm and consisting essentially of Bi, In and Sn;

each of said lead-free solder particles containing Bi with an amount of approximately 55 wt %, In with an amount of approximately 5.0 wt %, and Sn with an amount of approximately 40.0 wt %.

4. A lead-free solder powder as claimed in claim 3, wherein each of said solder particles carries, on a surface thereof, an alloy coating containing at least one of Sn and Ge with an amount of 0.1–5.0 wt %.

5. A lead-free solder powder as claimed in claim 3, wherein each of said solder particles carries, on a surface thereof, an alloy coating containing Sn and Bi with respective amounts exceeding 20.0 wt % for Sn and not exceeding 60.0 wt % for Bi.

6. A printed circuit board, comprising:

a substrate;

a conductor pattern provided on said substrate; and a lead-free solder alloy covering said conductor pattern, said lead-free solder alloy consisting essentially of Sn, Bi and In, with respective concentrations set such that said lead-free solder alloy has a melting temperature lower than a predetermined heat-resistant temperature of a component to be soldered upon said substrate, said solder alloy containing Bi with an amount of approximately 55 wt %, In with an amount of approximately 5.0 wt %, and Sn with an amount approximately 40.0 wt %.

7. An electronic component, comprising:

an electronic component body;

an electrode projecting from said electronic component body; and a lead-free solder alloy covering said electrode consisting essentially of Bi, In and Sn, said lead-free solder alloy containing Bi with an amount of approximately 55 wt %, In with an amount of approximately 5.0 wt %, and Sn with an amount of approximately 40.0 wt %, such that said lead-free solder particle has a melting temperature lower than a predetermined heat-resistant temperature of said electronic component.

8. An electronic apparatus, comprising:

a substrate;

a conductor pattern provided on said substrate;

an electronic component mounted upon said substrate in electrical connection with said conductor pattern, said electronic component having an electrode projecting therefrom; and a lead-free solder alloy connecting said electrode to said conductor pattern, said lead-free solder alloy consisting essentially of Bi, In and Sn and containing Bi with an amount of approximately 5.0 wt %, In with an amount of approximately 5.0 wt %, and Sn with an amount of approximately 40.0 wt %, such that said lead-free solder particle has a melting temperature lower than a predetermined heat-resistant temperature of said electronic component.

9. A lead-free solder powder comprising:

a plurality of lead-free solder particles each having a generally spherical shape with a diameter of 20–60 µm and consisting essentially of Bi, In and Sn;

each of said lead-free solder particles containing Bi with an amount of approximately 46.0 wt %, In with an amount of approximately 20.0 wt %, and Sn with an amount of approximately 34.0 wt %.

10. A printed circuit board, comprising:

a substrate;

a conductor pattern provided on said substrate; and a lead-free solder alloy covering said conductor pattern, said lead-free solder alloy consisting essentially of Sn, Bi and In, with respective concentrations set such that said lead-free solder alloy has a melting temperature lower than a predetermined heat-resistant temperature of a component to be soldered upon said substrate, said solder alloy containing Bi with an amount of approximately 46.0 wt %, In with an amount of approximately 20.0 wt %, and Sn with an amount of approximately 34.0 wt %.

11. An electronic component, comprising:

an electronic component body;

an electrode projecting from said electronic component body; and a lead-free solder alloy covering said electrode consisting essentially of Bi, In and Sn, said lead-free solder alloy containing Bi with an amount of approximately 46.0 wt %, In with an amount of approximately 20.0 wt %, and Sn with an amount of about 34.0 wt %, such that said lead-free solder particle has a melting temperature lower than a predetermined heat-resistant temperature of said electronic component.

12. An electronic apparatus, comprising:

a substrate;

a conductor pattern provided on said substrate;

an electronic component mounted upon said substrate in electrical connection with said conductor pattern, said electronic component having an electrode projecting therefrom; and a lead-free solder alloy connecting said electrode to said conductor pattern, said lead-free solder alloy consisting essentially of Bi, In and Sn and containing Bi with an amount of approximately 46.0 wt %, In with an amount of approximately 20.0 wt %, and Sn with an amount of about 34.0 wt %, such that said lead-free solder particle has a melting temperature lower than a predetermined heat-resistant temperature of said electronic component.

* * * * *

UNITED STATES PATENT AND TRADEMARK OFFICE
CERTIFICATE OF CORRECTION

PATENT NO.   : 6,184,475 B1
DATED        : February 6, 2001
INVENTOR(S)  : Masayuki Kitajima et al.

It is certified that error appears in the above-identified patent and that said Letters Patent is hereby corrected as shown below:

Please add the following:
[30] Foreign Application Priority Information
    Sept. 29, 1994   [JP]   Japan   6-235734
    Mar. 17, 1995    [JP]   Japan   7-059561

Signed and Sealed this

Twenty-eighth Day of August, 2001

Attest:

*Attesting Officer*

NICHOLAS P. GODICI
*Acting Director of the United States Patent and Trademark Office*